United States Patent
Takegami et al.

(10) Patent No.: US 11,598,817 B2
(45) Date of Patent: Mar. 7, 2023

(54) STORAGE CELL DIAGNOSTIC DEVICE AND STORAGE CELL DIAGNOSTIC METHOD, AND STORAGE CELL CONTROL SYSTEM

(71) Applicant: Mitsubishi Electric Corporation, Tokyo (JP)

(72) Inventors: Tomoki Takegami, Tokyo (JP); Toshihiro Wada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 264 days.

(21) Appl. No.: 16/975,401

(22) PCT Filed: Aug. 9, 2018

(86) PCT No.: PCT/JP2018/029960
§ 371 (c)(1),
(2) Date: Aug. 25, 2020

(87) PCT Pub. No.: WO2019/202752
PCT Pub. Date: Oct. 24, 2019

(65) Prior Publication Data
US 2020/0393518 A1 Dec. 17, 2020

(30) Foreign Application Priority Data
Apr. 17, 2018 (JP) .............................. JP2018-078923

(51) Int. Cl.
*G01R 31/392* (2019.01)
*G01R 31/396* (2019.01)
(Continued)

(52) U.S. Cl.
CPC ......... *G01R 31/392* (2019.01); *G01R 31/367* (2019.01); *G01R 31/396* (2019.01); *H02J 7/005* (2020.01); *H02J 7/0013* (2013.01); *H02J 7/007182* (2020.01)

(58) Field of Classification Search
CPC .. G01R 31/392; G01R 31/396; G01R 31/367; H02J 7/005; H02J 7/007182; H02J 7/0013
See application file for complete search history.

(56) References Cited

U.S. PATENT DOCUMENTS 10,126,369 B2    11/2018 Torai et al.
10,416,236 B2 *  9/2019 Uchino ............ H01M 10/4285
(Continued)

FOREIGN PATENT DOCUMENTS

JP    2013-140037 A    7/2013
JP    2013-247003 A    12/2013
(Continued)

OTHER PUBLICATIONS

International Search Report and Written Opinion dated Oct. 30, 2018 for PCT/JP2018/029960 filed on Aug. 9, 2018, 8 pages including English Translation of the International Search Report.
(Continued)

*Primary Examiner* — Drew A Dunn
*Assistant Examiner* — Pamela J Jeppson
(74) *Attorney, Agent, or Firm* — Xsensus LLP

(57) ABSTRACT

Provided is a storage battery diagnostic device including: a positive/negative electrode OCV model function generation unit (106) configured to generate a positive electrode OCV model function and a negative electrode OCV model function for N storage batteries by a sum of OCV element functions; and a storage battery model function parameter group estimation unit (107), which is configured to generate a storage battery model function based on the positive electrode OCV model function and the negative electrode OCV model function, and to generate an evaluation function L indicating an error between the time-series data stored in the data storage unit (104) and time-series data on estimation
(Continued)

data calculated by using the storage battery model function, to thereby calculate such an optimal group of estimation parameters of the storage battery model functions for the respective storage batteries as to minimize a value of the evaluation function L.

14 Claims, 14 Drawing Sheets

(51) Int. Cl.
*G01R 31/367* (2019.01)
*H02J 7/00* (2006.01)

(56) References Cited

U.S. PATENT DOCUMENTS

2011/0161025 A1* 6/2011 Tomura ............... G16Z 99/00
702/63

2013/0314050 A1 11/2013 Matsubara et al.
2015/0160300 A1* 6/2015 Ishii ................... G01R 31/3648
702/63
2016/0061908 A1* 3/2016 Torai ................... G01R 31/389
702/63

FOREIGN PATENT DOCUMENTS

| JP | 2015-230193 A | 12/2015 |
| JP | 6123844 B2 | 5/2017 |
| JP | 6151163 B2 | 6/2017 |

OTHER PUBLICATIONS

Bloom, I., et al., "Differential voltage analyses of high-power, lithium-ion cells: 1. Technique and application," Journal of Power Sources, vol. 139 (2005), Sep. 16, 2004, pp. 295-303.

* cited by examiner

DEGRADED STORAGE BATTERY DATA

DEGRADED STORAGE BATTERY DATA

DEGRADED STORAGE BATTERY DATA

STORAGE CELL DIAGNOSTIC DEVICE AND STORAGE CELL DIAGNOSTIC METHOD, AND STORAGE CELL CONTROL SYSTEM

CROSS-REFERENCE TO RELATED APPLICATIONS

The present application is based on PCT filing PCT/JP2018/029960, filed Aug. 9, 2018, which claims priority to 2018-078923, filed Apr. 17, 2018, the entire contents of each are incorporated herein by reference.

TECHNICAL FIELD

The present invention relates to a storage battery diagnostic device and a storage battery diagnostic method, which are configured to diagnose degradation of a storage battery.

BACKGROUND ART

A storage battery is known to be degraded progressively along with the use thereof resulting in decrease in its performance. Thus, a technology of diagnosing degradation of a storage battery is required in order to grasp a timing to replace a storage battery and predict a lifetime thereof. Further, a large number of used batteries are predicted to be produced due to widespread use of a fixed electricity storage system and widespread use of an electrically driven vehicle, such as an electric vehicle (EV), a hybrid electric vehicle (HEV), or a plug-in hybrid vehicle (PHV). As a result, there is an increased demand for diagnosis of degradation of a used battery, which assumes reuse of a storage battery.

In the diagnosis of a storage battery, a non-destructive and specific degradation diagnosis technology that uses measurement values of a current and a voltage, for example, is required.

As a related-art storage battery diagnosis technology, there is known a so-called dV/dQ curve analysis method that uses data on differentiation of a voltage V with respect to an electric quantity Q (e.g., refer to Non-Patent Literature 1). The dV/dQ curve analysis method involves performing specific degradation analysis by focusing on a peak position and peak shape of a dV/dQ curve that derives from each of a positive electrode and a negative electrode based on the fact that a voltage of a storage battery is represented as a combination of potentials of the positive electrode and the negative electrode.

At this time, when the dV/dQ curve of each of the positive electrode and the negative electrode is acquired in advance by decomposing a storage battery, for example, it is possible to perform accurate degradation analysis (e.g., refer to Patent Literature 1). In Patent Literature 1, history data on measurement values of chronologically acquired voltage values and current values of the storage battery is used.

Further, there is also disclosed a technology of diagnosing in detail degradation of a positive electrode and a negative electrode by using information on an OCV curve of each of the positive electrode and the negative electrode acquired in advance or adding a reference electrode to a storage battery, for example, to enable potentials of the positive electrode and the negative electrode to be measured, to thereby separate voltage data at the time of charging and discharging into pieces of data on OCVs of the positive electrode and the negative electrode (e.g., refer to Patent Literature 2 and Patent Literature 3).

Further, in order to apply a similar approach to state-of-charge (SOC) estimation, there is also disclosed a technology of updating an SOC-OCV curve representing an association relationship between an SOC and an OCV by identifying a change in shape of the SOC-OCV curve due to degradation (e.g., refer to Patent Literature 4). When there is an error in the SOC-OCV curve, the accuracy of estimating the SOC is degraded at the time of converting the OCV into the SOC, and thus update of the SOC-OCV curve is also an important technology.

CITATION LIST

Patent Literature

[0008] [PTL 1] JP 6123844 B2
[PTL 2] JP 2013-140037 A
[PTL 3] JP 6151163 B2
[PTL 4] JP 2015-230193 A

Non Patent Literature

[0009] [NPL 1] Bloom Ira and six others, "Differential Voltage Analyses of high-power, lithium-ion cells: 1. Technique and application", Journal of Power Sources 139 (2005), Sep. 16, 2004, pp. 295-303

SUMMARY OF INVENTION

Technical Problem

However, the above-mentioned technology has a problem in that information on the OCV curve of a positive electrode and the OCV curve of a negative electrode, or information on the dV/dQ curves of the positive electrode and the negative electrode is required. In order to acquire those pieces of information, those pieces of information are required to be acquired in advance by using a special storage battery with a reference electrode, which enables measurement of the potentials of the positive electrode and the negative electrode, or decomposing a storage battery for measurement, for example. However, the storage battery with a reference electrode is not widespread for general use, and decomposition and measurement of the storage battery require expertise and a test environment, for example.

Further, when a wide variety of storage batteries manufactured by various companies are to be diagnosed, it is extremely difficult to acquire in advance information on all the positive electrodes and negative electrodes. As a result, there is a demand for a technology that can implement diagnosis of degradation of a storage battery even under a situation in which only the limited information is acquired for a storage battery to be diagnosed.

The present invention has been made in order to solve the above-mentioned problems, and has an object to provide a storage battery diagnostic device and a storage battery diagnostic method, which enable degradation of a storage battery to be diagnosed even when there is no preliminary information on a positive electrode OCV curve and a negative electrode OCV curve of the storage battery, or on a positive electrode dV/dQ curve and a negative electrode dV/dQ curve of the storage battery.

Solution to Problem

According to one embodiment of the present invention, there is provided a storage battery diagnostic device including: N' voltage detection units configured to detect inter-terminal voltages of respective N storage batteries as N detected voltages, N being equal to or larger than 2, N' being equal to or smaller than N; N" current detection units configured to detect charge/discharge currents of the respective N storage batteries as N detected currents, N" being equal to or smaller than N; a data storage unit configured to store time-series data on the N storage batteries including time-series data on the detected currents and time-series data on the detected voltages; a positive/negative electrode OCV model function generation unit configured to obtain, based on the time-series data on the detected currents and the time-series data on the detected voltages stored in the data storage unit, OCV element functions that fit the time-series data on the detected voltages, to thereby generate each of positive electrode OCV model function and negative electrode OCV model function corresponding to the N storage batteries by a sum of the OCV element functions; and a storage battery model function parameter group estimation unit configured to generate, based on the positive electrode OCV model function and the negative electrode OCV model function, a storage battery model function corresponding to each of the N storage batteries, and to generate an evaluation function indicating an error between the time-series data stored in the data storage unit and time-series data on an estimation value calculated by using the storage battery model function, to thereby calculate such a group of estimation parameters of the N storage battery model functions corresponding to the respective N storage batteries as to minimize a value of the evaluation function.

Advantageous Effects of Invention

The storage battery diagnostic device according to the present invention is configured to obtain the OCV element functions that fit the time-series data on the detected voltages of the N storage batteries stored in the data storage unit, and generate the positive electrode OCV model function and the negative electrode OCV model function corresponding to the N storage batteries by the sum of the OCV element functions. With this configuration, it is possible to diagnose degradation of a storage battery to be diagnosed even when there is no preliminary information on a positive electrode OCV curve and a negative electrode OCV curve of the storage battery, or on a positive electrode dV/dQ curve and a negative electrode dV/dQ curve of the storage battery.

DESCRIPTION OF EMBODIMENTS

Now, description is made of a storage battery diagnostic device and a storage battery diagnostic method according to preferred embodiments of the present invention with reference to the drawings. In description of the drawings, the same or corresponding components are denoted by the same reference symbols, and a redundant description is omitted. The storage battery diagnostic device and the storage battery diagnostic method according to the embodiments of the present invention are configured to diagnose a degradation state of a storage battery based on charge/discharge data on the storage battery.

The storage battery diagnostic device and the storage battery diagnostic method according to each embodiment of the present invention are configured to use time-series data on a plurality of storage batteries to be diagnosed. With this, it is possible to perform specific degradation analysis by positive/negative electrode separation even when, for example, storage battery OCV data, or positive electrode OCV data and negative electrode OCV data are not acquired in advance. Further, it is possible to accurately reflect, in an OCV model, a change in OCV due to degradation. Herein, for the simplicity of description, an equilibrium potential of a positive electrode is referred to as "positive electrode OCV", and an equilibrium potential of a negative electrode is referred to as "negative electrode OCV".

First Embodiment

Figure 1:
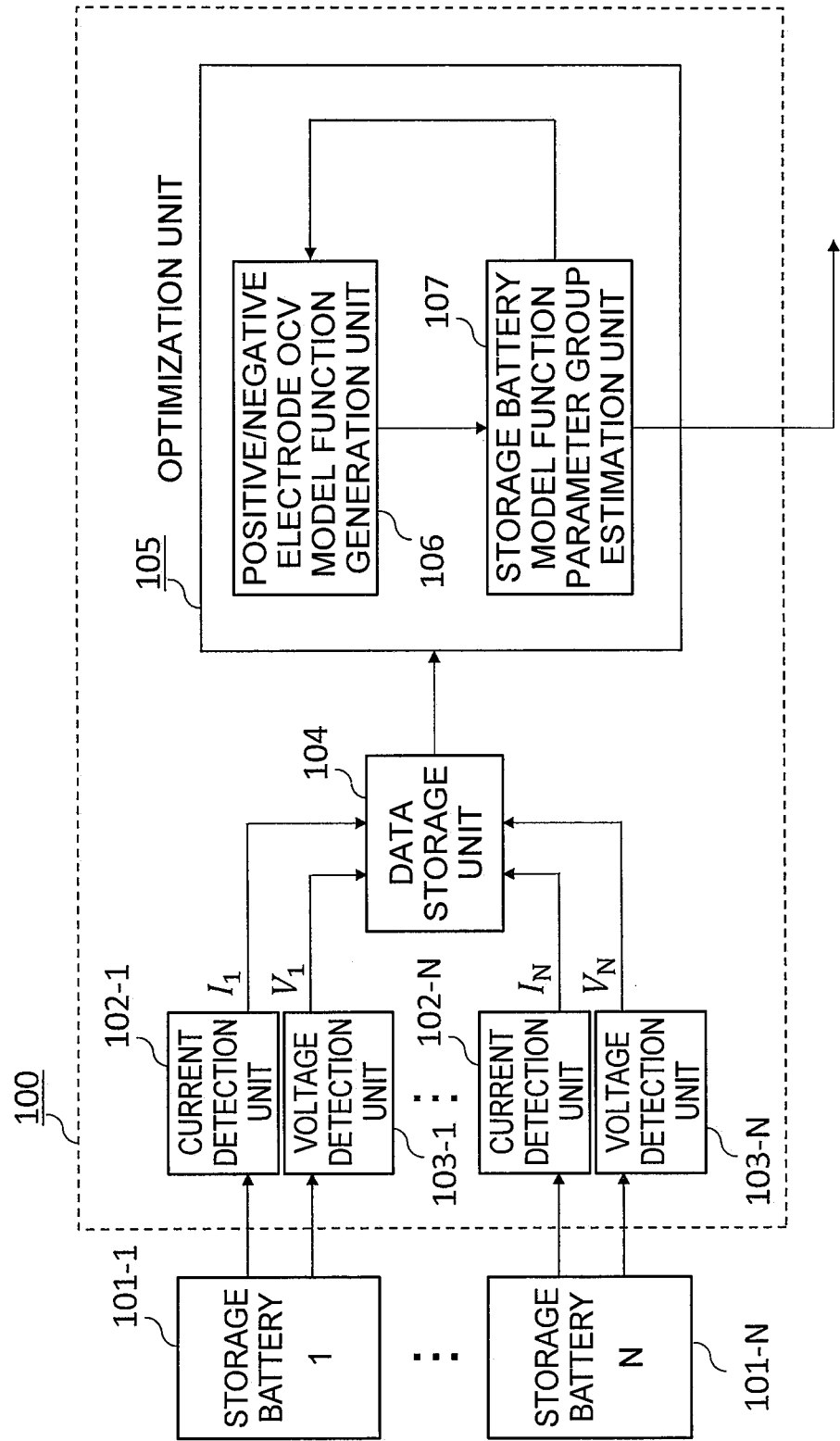
FIG. 1 is a block diagram for illustrating a configuration of a storage battery diagnostic device according to a first embodiment of the present invention.

FIG. 1 is a diagram for illustrating a configuration of a storage battery diagnostic device 100 according to a first embodiment of the present invention. In FIG. 1, N (N≥2) storage batteries 101-1, ..., 101-N connected to the storage battery diagnostic device 100 are also illustrated.

Figure 2:
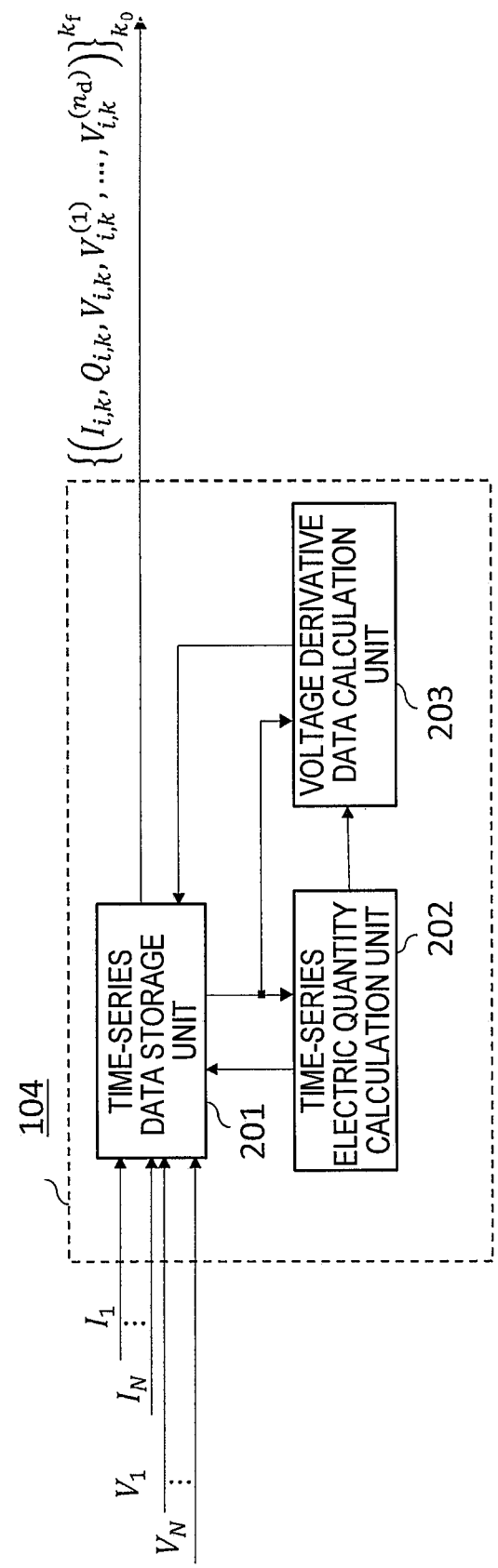
FIG. 2 is a block diagram for illustrating a configuration of a data storage unit of the storage battery diagnostic device according to the first embodiment of the present invention.
Figure 3:
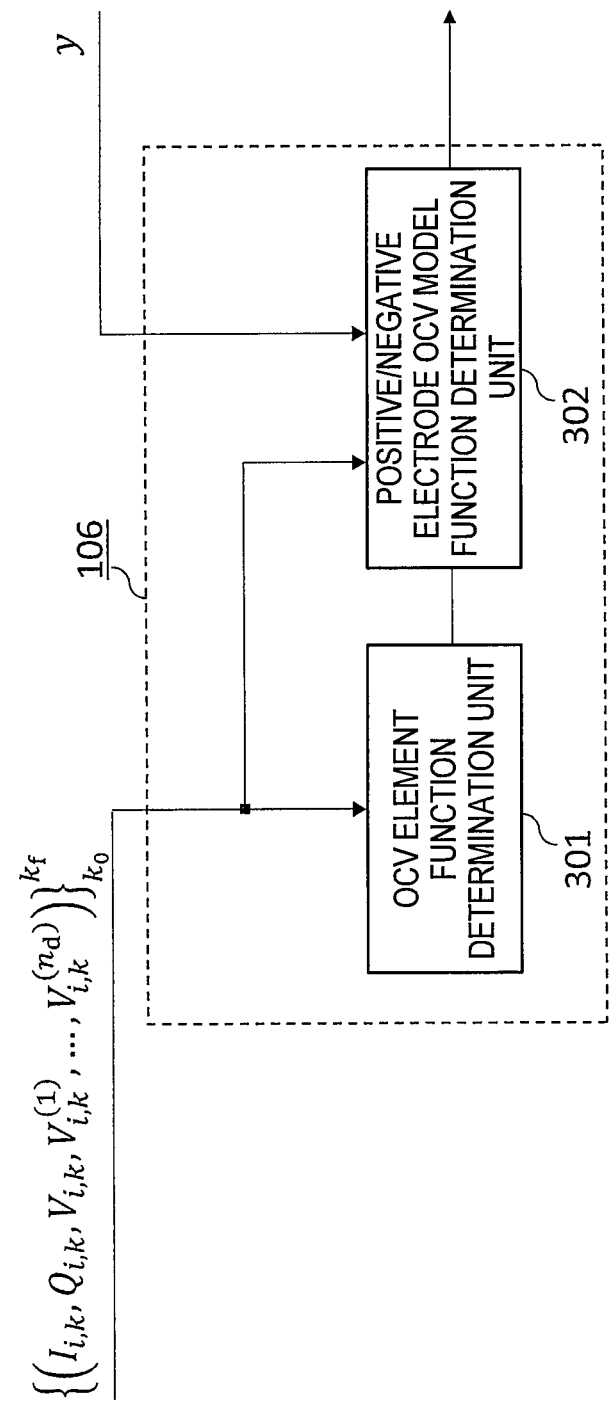
FIG. 3 is a block diagram for illustrating a configuration of a positive/negative electrode OCV model function generation unit of the storage battery diagnostic device according to the first embodiment of the present invention.
Figure 4:
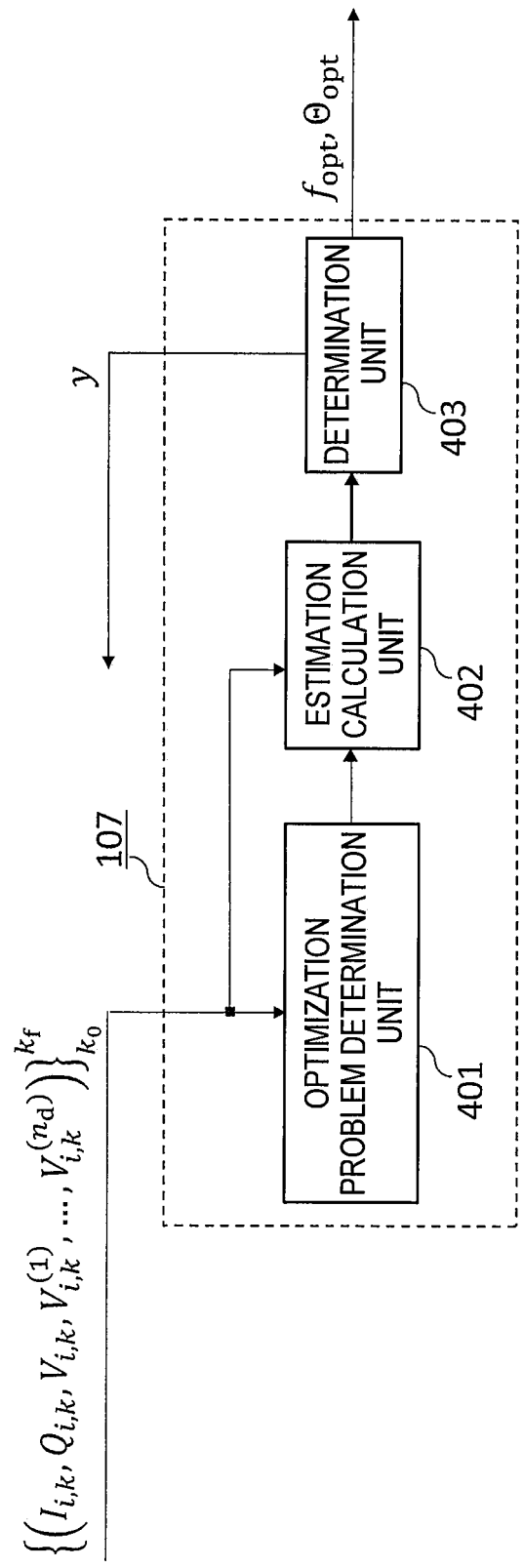
FIG. 4 is a configuration diagram for illustrating a configuration of a storage battery model function parameter group estimation unit of the storage battery diagnostic device according to the first embodiment of the present invention.
Figure 5:
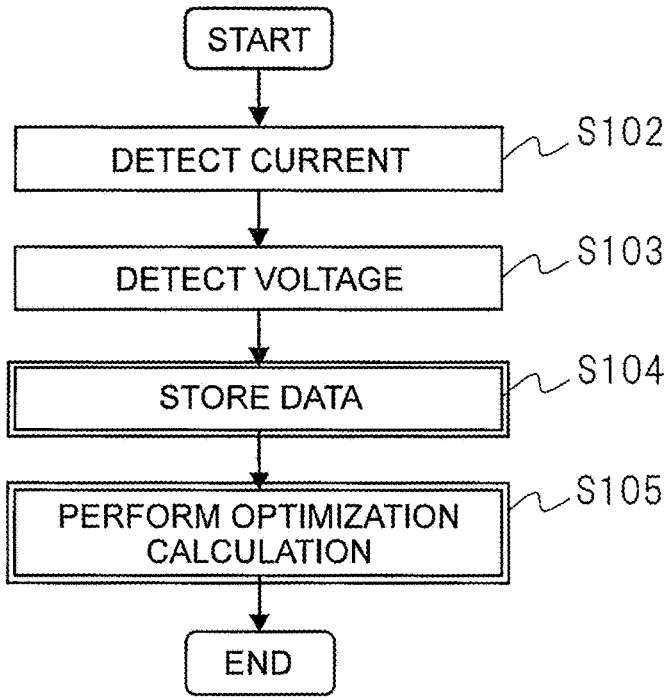
FIG. 5 is a flow chart for illustrating a series of operations to be executed by the storage battery diagnostic device according to the first embodiment of the present invention.
Figure 6:
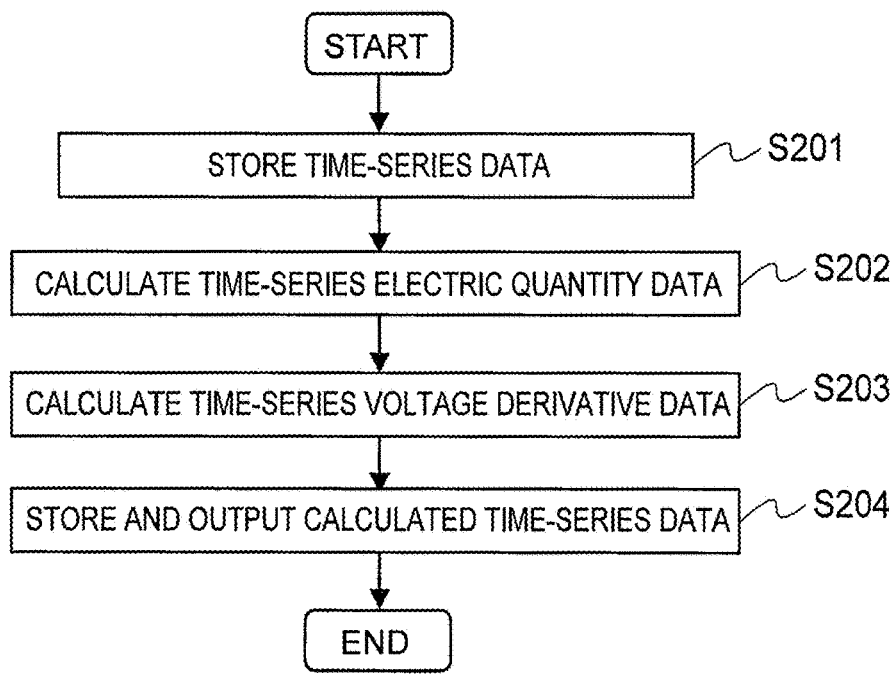
FIG. 6 is a flow chart for illustrating a series of operations to be executed by a data storage unit of the storage battery diagnostic device according to the first embodiment of the present invention.
Figure 7:
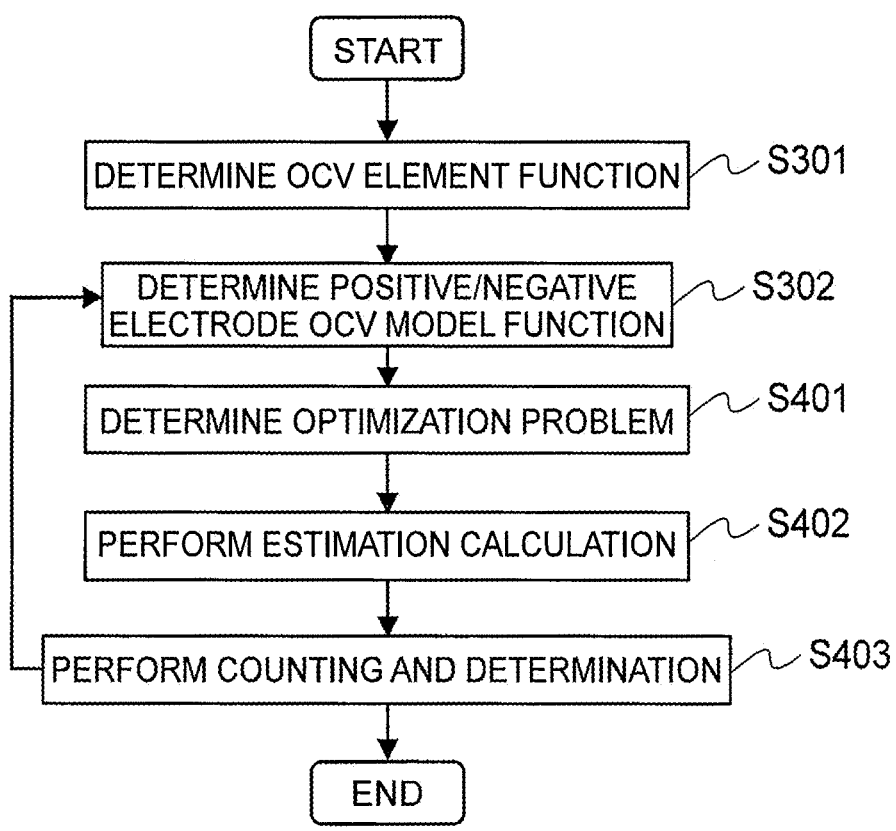
FIG. 7 is a flow chart for illustrating a series of operations to be executed by an optimization unit of the storage battery diagnostic device according to the first embodiment of the present invention.

Further, FIG. 2 is a diagram for illustrating an internal configuration of a data storage unit 104 arranged in the storage battery diagnostic device 100. FIG. 3 and FIG. 4 are diagrams for illustrating examples of respective internal configurations of a positive/negative electrode OCV model function generation unit 106 and a storage battery model function parameter group estimation unit 107 of an optimization unit 105 arranged in the storage battery diagnostic device 100. Further, FIG. 5 to FIG. 7 are flow charts for illustrating flow of processing to be executed by the storage battery diagnostic device 100.

In the first embodiment, a lithium ion storage battery is considered as a storage battery 101-$i$ (i=1 to N) to be diagnosed. The storage battery 101-$i$ has a positive electrode and a negative electrode, and includes general components of a chargeable/dischargeable storage device. The storage battery 101-$i$ may include, for example, a lead battery or a nickel metal hydride battery. Further, in this description, a storage battery including cells is considered as the storage battery 101-$i$ for the sake of simplicity of description. The storage battery 101-$i$ may be a module formed by connecting a plurality of cells in series or in parallel, or by a combination of both thereof.

As illustrated in FIG. 1, the storage battery diagnostic device 100 includes N current detection units 102-1, ..., 102-N, N voltage detection units 103-1, ..., 103-N, the data storage unit 104, and the optimization unit 105.

Further, as illustrated in FIG. 1, the optimization unit 105 includes the positive/negative electrode OCV model function generation unit 106 and the storage battery model function parameter group estimation unit 107.

The hardware configuration of the storage battery diagnostic device 100 illustrated in FIG. 1 is briefly described. In FIG. 1, components of the storage battery diagnostic device 100 each include a controller except for the current detection units 102-1 and 102-N, and the voltage detection units 103-1, ..., 103-N. The controller includes a processor and a memory. Functions of components forming the storage battery diagnostic device 100, namely, the data storage unit 104 and the optimization unit 105, are implemented by software, firmware, or a combination thereof. The software and firmware are described as programs, and stored in a memory. The processor is configured to read and execute the program stored in the memory, to thereby implement the function of each component of the data storage unit 104 and the optimization unit 105 of the storage battery diagnostic device 100.

Now, referring to FIG. 5, a flow of processing to be executed by the storage battery diagnostic device 100 is briefly described. First, in Step S102, the N current detection units 102-1, ..., 102-N each detect a detected current Ii of the storage battery 101-$i$. Next, in Step S103, the N voltage detection units 103-1, ..., 103-N each detect a detected voltage Vi of the storage battery 101-$i$. Next, in Step S104, the data storage unit 104 uses values of the detected current Ii and the detected voltage Vi to store time-series data on the storage battery 101-$i$. Next, in Step S105, the optimization unit 105 uses the time-series data of the data storage unit 104 to generate a storage battery model function of the storage battery 101-$i$ and execute estimation calculation by an optimization method. With this, the optimization unit 105 calculates such a group of parameters of the storage battery model function as to reduce a difference between the time-series data on the detected voltage Vi and time-series data on an estimated voltage obtained by the storage battery model function. Alternatively, the optimization unit 105 may calculate such a group of parameters of the storage battery model function as to reduce a difference between a derivative of the detected voltage Vi and a derivative of the estimated voltage obtained by the storage battery model function.

Now, a detailed description is made of each component of the storage battery diagnostic device 100.

As illustrated in FIG. 1, a current detection unit 102-$i$ is connected to the storage battery 101-$i$. The current detection unit 102-$i$ is configured to detect a charge/discharge current of the storage battery 101-$i$ as a detected current Ii [A]. In the above description, the number of current detection units 102 is set to N. However, the number of current detection units 102 is not limited thereto, and the number of current detection units 102 may be equal to or smaller than N. Specifically, for example, when a plurality of that is, at least two or more of the storage batteries 101-1, ..., 101-N are connected in series, the detected current Ii [A] of each storage battery 101-$i$ is not required to be detected. The reason for this is that currents flowing through respective storage batteries connected in series are equal to each other, and thus when the detected current Ii [A] of one storage battery 101-$i$ among storage batteries connected in series is acquired by one current detection unit 102-$i$, the detected currents of the other storage batteries connected in series can be replaced with the detected current Ii [A] acquired by the current detection unit 102-$i$. Therefore, in such a case, the number of current detectors 102 may be smaller than N.

The voltage detection unit 103-$i$ is connected to a corresponding storage battery 101-$i$. The voltage detection unit 103-$i$ is configured to detect a voltage of the storage battery 101-$i$ as a detected voltage Vi [V]. In the above description, the number of voltage detection units 103 is set to N. However, the number of voltage detection units 103 is not limited thereto, and the number of voltage detection units 103 may be equal to or smaller than N. Specifically, for example, when a plurality of, that is, at least two or more of the storage batteries 101-1, ..., 101-N are connected in parallel, the detected voltage Vi [V] of each storage battery 101-$i$ is not required to be detected. The reason for this is that voltages of respective storage batteries connected in parallel are equal to each other, and thus when the detected voltage Vi [V] of one storage battery 101-$i$ among storage batteries connected in parallel is acquired by one voltage detection unit 103-$i$, the detected voltages of the other storage batteries connected in parallel can be replaced with the detected voltage Vi [V] acquired by the voltage detection unit 103-$i$. Therefore, in such a case, the number of voltage detection units 103 may be smaller than N.

The data storage unit 104 is configured to use values of the detected current Ii output from the current detection unit 102-$i$ and the detected voltage Vi output from the voltage detection unit 103-$i$ to generate and store times-series data on each storage battery 101-$i$ ($1 \le i \le N$). The data storage unit 104 is further configured to calculate and store time-series data on an electric quantity of each storage battery 101-$i$ and time-series data on a derivative of the detected voltage Vi.

FIG. 2 is an illustration of an exemplary internal configuration of the data storage unit 104. In the example of FIG. 2, the data storage unit 104 includes a time-series data storage unit 201, a time-series electric quantity calculation unit 202, and a voltage derivative data calculation unit 203.

The time-series data storage unit 201 is configured to use the values of the detected current Ii output from the current detection unit 102-$i$ and the detected voltage Vi output from the voltage detection unit 103-$i$ to store, into a memory, pieces of time-series data on the current and voltage of each storage battery 101-$i$ ($1 \le i \le N$) as the following time-series current data and time-series voltage data:

$$\{(V_{i,k}, I_{i,k})\}_{k_o}^{k_f}$$

Further, the time-series data storage unit 201 is configured to store each of time-series electric quantity data on each storage battery 101-$i$ calculated by the time-series electric quantity calculation unit 202 and voltage derivative data calculated by the voltage derivative data calculation unit 203. Further, the time-series data storage unit 201 is configured to output those stored pieces of data to the optimization unit 105. The following notation:

$$\{(x_{i,k}, y_{i,k})\}_{k_o}^{k_f}$$

is defined by the following expression.

$$\{(x_{i,k}, y_{i,k})\}_{k_o}^{k_f} := \{(x_{i,k_o}, y_{i,k_o}), (x_{i,k_o+1}, y_{i,k_o+1}), \ldots, (x_{i,k_f}, y_{i,k_f})\}$$

Further, $k$ [s] ($k = k_0$ to $k_r$) represents a sample time, and the relationship of $t = t_s k$ is satisfied between a current time $t$ [s] and a sampling period $t_s$ [s].

The time-series electric quantity calculation unit 202 is configured to multiply, for example, a current by a period in which the current has flowed based on the following time-series current data:

$$\{(I_{i,k})\}_{k_o}^{k_f}$$

output from the time-series data storage unit 201, to thereby calculate an electric quantity $Q_{i,k}$ [C] of each storage battery 101-$i$ for output to the time-series data storage unit 201 as the following time-series electric quantity data:

$$\{Q_{i,k}\}_{k_o}^{k_f}$$

The method of calculating the electric quantity $Q_{i,k}$ [C] of each storage battery 101-$i$ is not limited thereto, and any known method may be employed.

The voltage derivative data calculation unit 203 is configured to use the following time-series voltage data:

$$\{V_{i,k}\}_{k_o}^{k_f}$$

output from the time-series data storage unit 201, and the following time-series electric quantity data:

$$\{Q_{i,k}\}_{k_o}^{k_f}$$

output from the time-series electric quantity calculation unit 202, to thereby calculate first-order to $n_d$th-order voltage derivative curves ($n_d \ge 1$) for output to the time-series data storage unit 201. That is, when the following value obtained by differentiating the detected voltage Vi,k at the time k by the electric quantity Qi,k:

$$d^j V_i / dQ_i^j$$

is represented as follows:

$$V_{i,k}^{(j)}$$

the voltage derivative data calculation unit 203 calculates and outputs, as the time-series voltage derivate data, the following first-order to $n_d$th-order voltage derivative curves:

$$\{(V_{i,k}^{(1)}, \ldots, V_{i,k}^{(n_d)})\}_{k_o}^{k_f}$$

The symbol j represents an integer of from 1 to $n_d$. The number $n_d$ may be set appropriately.

In actuality, discrete time-series data cannot be differentiated, and thus the voltage derivative data calculation unit 203 performs approximate differentiation calculation by a difference method, for example. Further, in general, differentiation calculation or difference calculation amplifies high-frequency noise of an original signal, and thus a low-pass filter configured to execute, for example, sample averaging processing before or after differentiation calculation may be used to reduce the high-frequency noise. As another example, a more sophisticated filter, for example, a Savitzky-Golay filter, may be used. As still another example, after noise is removed by approximating time-series voltage data with a horizontal axis representing an electric quantity by a function through use of a kernel method, for example, the function may be differentiated.

In this manner, the time-series data storage unit 201 stores time-series current data, time-series voltage data, time-series electric quantity data, and time-series voltage derivative data into the memory. As a result, the time-series data output from the time-series data storage unit 201 as output from the data storage unit 104 is as follows:

$$\{(I_{i,k}, Q_{i,k}, V_{i,k}, V_{i,k}^{(1)}, \ldots, V_{i,k}^{(n_d)})\}_{k_o}^{k_f} \ (i=1, \ldots, N)$$

In this manner, the time-series data output from the data storage unit 104 includes time-series current data, time-series electric quantity data, time-series voltage data, and time-series voltage derivative data.

Now, referring to FIG. 6, description is briefly made of a flow of processing to be executed by the data storage unit 104. First, in Step S201, the time-series data storage unit 201 uses values of the detected current Ii output from the current detection unit 102-$i$ and the detected voltage Vi output from the voltage detection unit 103-$i$ to store time-series current data and time-series voltage data on each storage battery 101-$i$ ($1 \le i \le N$) into the memory. Next, in Step S202, the time-series electric quantity calculation unit 202 uses the detected current Ii output from the time-series data storage unit 201 to calculate time-series electric quantity data on each storage battery 101-$i$. Next, in Step S203, the voltage derivative data calculation unit 203 calculates first-order to $n_d$th-order voltage derivative curves ($n_d \ge 1$) as the time-series voltage derivative data based on the time-series voltage data output from the time-series data storage unit 201 and the time-series electric quantity data output from the time-series electric quantity calculation unit 202. Next, in Step S204, the time-series data storage unit 201 stores time-series data on the storage battery 101-$i$, which includes the time-series current data, the time-series electric quantity data, the time-series voltage data, and the time-series voltage derivative data, into the memory, and outputs the time-series data to the optimization unit 105.

The optimization unit 105 receives input of the time-series data output from the data storage unit 104 to generate a positive electrode OCV model function and a negative electrode OCV model function for the storage battery 101-$i$ based on the time-series data of the data storage unit 104. Further, the optimization unit 105 uses the positive electrode OCV model function and the negative electrode OCV model function to generate a storage battery model function for the storage battery 101-$i$ and execute estimation calculation by an optimization method, to thereby calculate such a group of estimation parameters of the storage battery model function as to reduce a difference between the time-series data on the detected voltage $V_i$, which is detected by the voltage detection unit 103-1, . . . , 103-N, or the time-series voltage derivative data, and the time-series data on an estimated voltage obtained by the storage battery model function or the time-series voltage derivative data on the estimated voltage. In the estimation calculation using the optimization method, such a group of estimation parameters of the storage battery model function as to reduce a difference between the time-series data on the detected current $I_i$, which is detected by the current detection units 102-1, . . . , 102-N, and the time-series data on the estimated current obtained by the storage battery model function may be calculated.

Now, referring to FIG. 7, description is briefly made of a flow of processing to be executed by the optimization unit 105. As illustrated in FIG. 1, the optimization unit 105 includes the positive/negative electrode OCV model function generation unit 106 and the storage battery model function parameter group estimation unit 107. Further, as illustrated in FIG. 3, the positive/negative electrode OCV model function generation unit 106 includes an OCV element function determination unit 301 and a positive/negative electrode OCV model function determination unit 302. Further, as illustrated in FIG. 4, the storage battery model function parameter group estimation unit 107 includes an optimization problem determination unit 401, an estimation calculation unit 402, and a determination unit 403.

At this time, as illustrated in FIG. 7, first, in Step S301, the OCV element function determination unit 301 uses the time-series voltage derivative data among pieces of time-series data output from the data storage unit 104 to detect a region indicating a characteristic change in voltage from the time-series data on the detected voltage $V_i$ of the storage battery 101-$i$, and assign one by one, to each region, an OCV element function that fits the change in voltage of the region by selecting the OCV element function from among a plurality of candidates of the OCV element function.

Next, in Step S302, the positive/negative electrode OCV model function determination unit 302 determines whether the OCV element function assigned to the region is to belong to the positive electrode or the negative electrode, generates all the combinations of the OCV element functions belonging to the positive electrode or the negative electrode, and generates, for each combination, a positive electrode OCV model function based on a sum of OCV element functions belonging to the positive electrode and a negative electrode OCV model function based on a sum of OCV element functions belonging to the negative electrode.

Next, in Step S401, the optimization problem determination unit 401 generates a storage battery model function including the positive electrode OCV model function and the negative electrode OCV model function, and determines a group of estimated parameters of the storage battery model function and an evaluation function L for evaluating the storage battery model function, to thereby determine an optimization problem to be solved.

Next, in Step S402, the estimation calculation unit 402 calculates such a group of estimation parameters of the storage battery model function as to minimize the evaluation function L by an optimization method for the above-mentioned combination based on the time-series data output from the data storage unit 104, the storage battery model function output from the optimization problem determination unit 401, the group of estimation parameters, and the evaluation function L. Then, the estimation calculation unit 402 outputs the group of estimation parameters and the value of the evaluation function L at a time when the group of estimation parameters is used.

Next, in Step S403, the determination unit 403 compares the value of the evaluation function L output from the estimation calculation unit 402 with the value of the evaluation function L calculated before, and stores such a group of estimation parameters as to minimize the value of the evaluation function L at that time.

Next, the processing returns to Step S302. The positive/negative electrode OCV model function determination unit 302 changes the combination of OCV element functions, which are included in the positive electrode OCV model function and the negative electrode OCV model function, belonging to the positive electrode or the negative electrode, to thereby regenerate a positive electrode OCV model function and a negative electrode OCV model function.

Next, in Step S401, the optimization problem determination unit 401 generates a storage battery model function including the regenerated positive electrode OCV model function and negative electrode OCV model function, and determines the group of estimation parameters of the storage battery model function and the evaluation function L for evaluating the storage battery model function.

Next, in Step S402, the estimation calculation unit 402 calculates such a group of estimation parameters as to minimize the value of the evaluation function L based on the time-series data output from the data storage unit 104, the storage battery model function regenerated by the optimization problem determination unit 401, the group of estimation parameters, and the evaluation function L. Then, the estimation calculation unit 402 outputs the group of estimation parameters and the value of the evaluation function L at a time when the group of estimation parameters is used.

In this manner, the combination of OCV element functions belonging to the positive electrode or the negative electrode is changed to repeatedly execute the processing of from Step S302 to Step S402, and in Step S403, the determination unit 403 outputs, as a definitive estimation result, the storage battery model function and the group of estimation parameters of the storage battery model function at a time when the value of the evaluation function L becomes smaller than a threshold value, or the value of the evaluation function L becomes the smallest through repetition by the maximum number of times set in advance.

Now, description is made in detail of each configuration of the optimization unit 105.

The group of estimation parameters to be output from the optimization unit 105 includes a first group of parameters, which is shared by the N storage batteries 101-$i$, and a second group of parameters, which is different among the N storage batteries 101-$i$. Now, the first group of parameters is referred to as "group of positive/negative electrode OCV model function parameters $\Phi p$ and $\Phi n$" and the second group of parameters is referred to as "group of capacity parameters $\theta p$, $\theta n$, and $\theta s$".

The group of capacity parameters herein refers to a positive electrode capacity retention rate θp with respect to a reference storage battery, a negative electrode capacity retention rate θn with respect to the reference storage battery, and an SOC shift amount θs between the positive electrode and the negative electrode with respect to the reference storage battery. The reference storage battery is not always required to be a real storage battery, but may be a conceptual storage battery, for example, a storage battery having the same characteristics as those of the specification.

Figure 8:
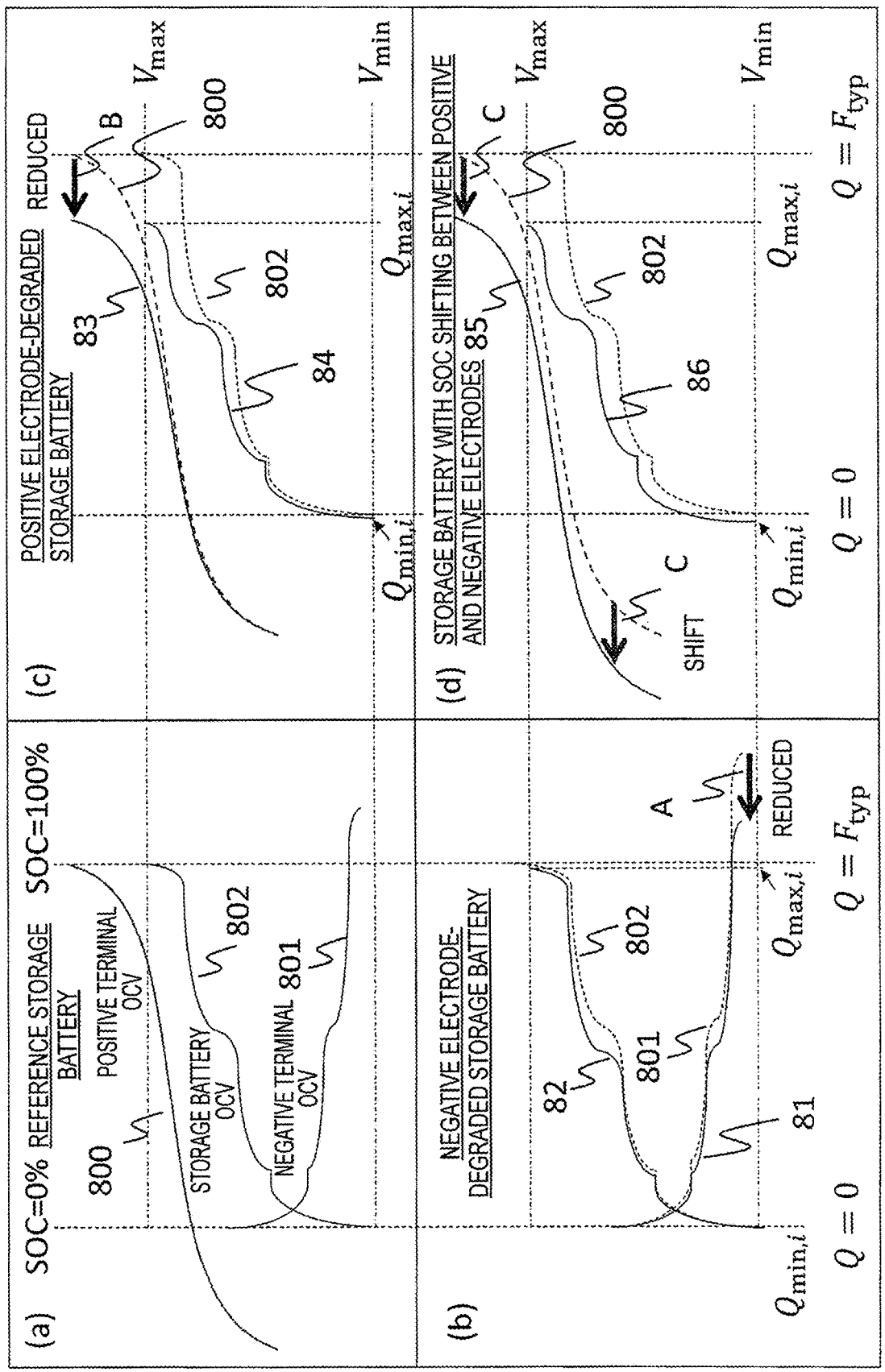
FIG. 8 is an illustration for showing an influence of a change in group of capacity parameters due to storage battery degradation on a storage battery OCV and a full charge capacity.

Decreases in the positive electrode capacity retention rate θp and the negative electrode capacity retention rate θn is caused by deactivation of an electrode active material, and those decreases are exhibited as respective reductions of the positive electrode OCV curve and the negative electrode OCV curve in a horizontal direction thereof. Those reductions in the horizontal direction are indicated by the arrow B in part (c) of FIG. 8 and the arrow A in part (b) of FIG. 8, respectively, for example. Details of FIG. 8 are described later.

First, when the positive electrode OCV, a reference characteristic of the positive electrode OCV, and an electric quantity of the positive electrode are represented by OCVp [V], $OCV_p^{typ}$ [V], and Qp [C], respectively, Expression (1) given below is satisfied.

$$OCV_p(\theta_p^{-1}Q_p) = OCV_p^{typ}(Q_p) \quad (1)$$

Similarly, when the negative electrode OCV, a reference characteristic of the negative electrode OCV, and an electric quantity of the negative electrode are represented by OCVn [V], $OCV_n^{typ}$ [V], and Qn [C], respectively, Expression (2) given below is satisfied.

$$OCV_n(\theta_n^{-1}Q_n) = OCV_n^{typ}(Q_n) \quad (2)$$

Meanwhile, the SOC shift amount θs between the positive electrode and the negative electrode is a value indicating a phenomenon in which a positional relationship between the SOC of the positive electrode and the storage battery OCV and a positional relationship between the SOC of the negative electrode and the storage battery OCV deviate due to lithium consumption by, for example, precipitation and film growth at a solid electrolyte interface (SET) of the negative electrode mainly at the time of charging.

When a lost electric quantity due to lithium consumption is represented by Qc [C] for a total electric quantity Qb [C] of the storage battery, a relationship of Expression (3) given below is satisfied.

$$Q_b = Q_p + Q_n + Q_c \quad (3)$$

When a part of lithium ions is consumed through precipitation or usage for film growth at the negative electrode SET at the time of charging the storage battery 101-i, that is, in the process of lithium ions stored in the positive electrode moving to the negative electrode, the charged amount of the negative electrode under a full charge state of the storage battery becomes smaller than that before lithium consumption. The positive electrode OCV curve appears to have shifted toward left with respect to the negative electrode. This phenomenon is SOC shifting between the positive electrode and the negative electrode. This shifting toward left is indicated by the arrow C in part (d) of FIG. 8 described later, for example.

When an OCV of the reference storage battery, a reference full charge capacity of the storage battery, and an electric quantity of the storage battery 101-i are represented by $OCV^{typ}$ [V], $F_{typ}$ [C], and Q [C], respectively, the OCV of the reference storage battery is represented by Expression (4) given below.

$$OCV^{typ}(Q) = OCV_p^{typ}(Q) - OCV_n^{typ}(Q) = f_p\left(\frac{Q}{F_{typ}}\right) - f_n\left(\frac{Q}{F_{typ}}\right) \quad (4)$$

In this expression, Q represents an electric quantity at a time when, in the reference storage battery, an electric quantity with the OCV being a lower limit voltage Vmin set in advance is set to 0, and $F_{typ}$ represents an electric quantity at a time when the OCV is an upper limit voltage Vmax set in advance.

In view of the above, the OCV of the storage battery i is represented by Expression (5) given below by reflecting the group of capacity parameters θp, θn, and θs in the electric quantity Qi [C] of the storage battery i.

$$OCV_i(Q_i) = \\ OCV_{p,i}(Q_i) - OCV_{n,i}(Q_i) = f_{p,i}\left(\frac{Q_i}{\theta_{p,i}F_{typ}} + \theta_{s,i}\right) - f_{n,i}\left(\frac{Q_i}{\theta_{n,i}F_{typ}}\right) \quad (5)$$

In this expression, $f_{p,i}$ and $f_{n,i}$ represent the OCV function of the positive electrode and the OCV function of the negative electrode, respectively. The full charge capacity is simply a reference value, and may be a rated capacity or nominal capacity of the storage battery, or a full charge capacity measured for a new storage battery. Alternatively, for example, the full charge capacity of any one of a plurality of storage batteries to be diagnosed may be used.

The full charge capacity of the storage battery is defined as an electric quantity of the storage battery at a time when the electric quantity of the storage battery with the OCV being the lower limit voltage Vmin set in advance is set to 0 and the OCV is the upper limit voltage Vmax set in advance. Thus, the charged amounts of respective positive and negative electrodes at a time of the lower limit voltage Vmin and the upper limit voltage Vmax change depending on the values of the group of capacity parameters.

The charged amounts Qp and Qn of the positive electrode and the negative electrode cannot be known unless those amounts are acquired in advance by, for example, an experiment of decomposing the storage battery 101-i, but a relative difference value with respect to the reference storage battery can be known. Specifically, when $Q_{min,i}$ [C] and $Q_{max,i}$ [C] represent the electric quantity of the storage battery at the time of the lower limit voltage Vmin and the electric quantity of the storage battery at the time of the upper voltage Vmax, respectively, the values of $Q_{min,i}$ and $Q_{max,i}$ are easily obtained by, for example, a liner search method based on Expressions (6) and (7) given below, which correspond to the lower limit voltage and the upper limit voltage, respectively.

$$V_{min} = f_p\left(\frac{Q_{min,i}}{\theta_{p,i}F_{typ}} + \theta_{s,i}\right) - f_n\left(\frac{Q_{min,i}}{\theta_{n,i}F_{typ}}\right) \quad (6)$$

$$V_{max} = f_p\left(\frac{Q_{max,i}}{\theta_{p,i}F_{typ}} + \theta_{s,i}\right) - f_n\left(\frac{Q_{max,i}}{\theta_{n,i}F_{typ}}\right) \quad (7)$$

It should be noted that $Q_{min,i}$ and $Q_{max,i}$ are values with the reference storage battery serving as a reference. Thus, for example, $Q_{min,i}$ may take a negative value.

When $Q_{min,i}$ and $Q_{max,i}$ obtained from Expression (6) and Expression (7) are used, the full charge capacity Fi [C] of the storage battery 101-i can be acquired as Expression (8) given below.

$$F_i = Q_{max,i} - Q_{min,i} \quad (8)$$

FIG. 8 is an illustration for showing a relationship among the OCV curve, degradation, and the full charge capacity at a time when the vertical axis represents a voltage and the horizontal axis represents an electric quantity. Part (a) of FIG. 8 on the upper left side represents a positive electrode OCV (reference numeral 800), negative electrode OCV (reference numeral 801), and storage battery OCV (reference numeral 802) of the reference storage battery. Part (b) of FIG. 8 on the lower left side represents a negative electrode OCV (reference numeral 81) and storage battery OCV (reference numeral 82) of a storage battery having a degraded negative electrode. Further, part (c) of FIG. 8 on the upper right side represents a positive electrode OCV (reference numeral 83) and storage battery OCV (reference numeral 84) of a storage battery having a degraded positive electrode. Further, part (d) of FIG. 8 on the lower right side represents a positive electrode OCV (reference numeral 85) and storage battery OCV (reference numeral 86) of a storage battery in which SOC shifting between the positive electrode and the negative electrode has occurred due to lithium consumption. Further, in part (b) of FIG. 8 to part (d) of FIG. 8, the OCV indicated by the broken line or dotted line each represents the OCV of the reference storage battery, and thus the same reference numerals as those of part (a) of FIG. 8 are assigned. In part (a) of FIG. 8 to part (d) of FIG. 8, the positive electrode OCV and the negative electrode OCV are drawn so as to fall within one drawing sheet of FIG. 8, and thus the position of the vertical axis is not completely accurate.

On the basis of the graphs of FIG. 8, it is understood that the manner of change in shape of the curve of the positive electrode OCV or the negative electrode OCV since the storage battery was a new product is different for each of the three capacity degradation patterns.

First, on the basis of part (b) of FIG. 8, it is understood that, compared to the negative electrode OCV (reference numeral 801) of the reference storage battery, in the storage battery having a degraded negative electrode, the curve of the negative electrode OCV (reference numeral 81) is reduced in the horizontal direction as indicated by the arrow A due to decrease in negative electrode capacity retention rate θn.

Further, on the basis of part (c) of FIG. 8, it is understood that, compared to the positive electrode OCV (reference numeral 800) of the reference storage battery, in the storage battery having a degraded positive electrode, the curve of the positive electrode OCV (reference numeral 83) is reduced in the horizontal direction as indicated by the arrow B due to decrease in positive electrode capacity retention rate θp.

Further, on the basis of part (d) FIG. 8, compared to the reference storage battery indicating a state before lithium consumption, in the storage battery for which SOC shifting between the positive electrode and the negative electrode has occurred due to lithium consumption, the charged amount of the negative electrode under the full charge state of the storage battery becomes smaller due to the consumption of lithium ions as described above. Thus, in terms of the negative electrode, it is understood that the curve of the positive electrode OCV (reference numeral 85) has shifted toward left as indicated by the arrow C with respect to the positive electrode OCV (reference numeral 800) of the reference storage battery.

Further, on the basis of the graphs of FIG. 8, it is understood that the manner of change in shape of the curve of the storage battery OCV since the storage battery was a new product is also different for each of three capacity degradation patterns.

First, the storage battery OCV (reference numeral 84) of the storage battery having a degraded positive electrode in part (c) of FIG. 8 and the storage battery OCV (reference numeral 86) of the storage battery in part (d) of FIG. 8 for which SOC shifting between the positive electrode and the negative electrode has occurred are compared with each other. The storage battery OCV (reference numeral 84) of the storage battery having a degraded positive electrode in part (c) of FIG. 8 and the storage battery OCV (reference numeral 86) of the storage battery in part (d) of FIG. 8 for which SOC shifting between the positive electrode and the negative electrode has occurred have a slightly similar shape change. However, when each of those OCVs is compared with the storage battery OCV (reference numeral 802) of the reference storage battery, there is a difference in that part (c) of FIG. 8 has a small potential change in a region in which the electric quantity is small, whereas part (d) of FIG. 8 has a clearly high potential even in the region in which the electric quantity is small.

Further, in part (b) of FIG. 8 to part (d) of FIG. 8, the electric quantity $Q_{max,i}$ under the upper limit voltage and the electric quantity $Q_{min,i}$ under the lower limit voltage deviate from the electric quantity $Q_{max,i}$ and the electric quantity $Q_{min,i}$ in the case of the reference storage battery due to the influence of degradation, respectively. As a result, it is understood that the full charge capacity Fi represented by Expression (8) becomes smaller. The variations of $Q_{max,i}$ and $Q_{min,i}$ greatly depend on the capacity degradation pattern and the shapes of the positive and negative electrode OCVs, and in the case of FIG. 8, it is understood that the value of SOC=0% of the cell is mainly influenced by the negative electrode, whereas the value of SOC=100% is mainly influenced by the positive electrode.

In this embodiment, contrary to Patent Literature 2 or Patent Literature 3 described above, the positive electrode OCV and the negative electrode OCV are not acquired in advance, and thus in addition to the group of capacity parameters described above, the respective OCV functions fp and fn of the positive and negative electrodes are required to be determined, and a group of parameters that characterize those shapes are required to be estimated. Now, a detailed principle thereof is described together with an internal operation principle of the optimization unit 105.

In the optimization unit 105, the positive/negative electrode OCV model function generation unit 106 generates an OCV model function of each of the positive electrode and the negative electrode based on the time-series data output from the data storage unit 104 and a determination signal output from the storage battery model function parameter group estimation unit 107.

Specifically, the positive/negative electrode OCV model function generation unit 106 generates the positive electrode OCV model function and the negative electrode OCV model function by adding up one or more OCV element functions.

The positive electrode OCV model function fp and the negative electrode OCV model function fn are represented by Expression (9) and Expression (10) given below, respectively, when $f_p^j$ represents a j-th positive electrode OCV element function and $f_n^j$ represents a j-th negative electrode OCV element function.

$$f_p(Q) = \sum_{j=1}^{m_p} f_p^j(Q) \tag{9}$$

and $$f_n(Q) = \sum_{j=1}^{m_n} f_n^j(Q) \quad (10)$$

At this time, the storage battery OCV model function f is represented by Expression (11) given below.

$$f(Q)=f_p(Q)-f_n(Q) \quad (11)$$

In general, in the field of electrochemistry, there is known a Nernst equation, which is represented as a logarithm function, as a model for describing the OCV of a storage battery. Meanwhile, a large number of real storage battery electrodes have a stepwise potential change due to phase change of an electrode material, and thus the OCV cannot be modeled accurately only with the Nernst equation.

In order to model such a stepwise potential change due to phase change, when a candidate of the positive electrode OCV element function and the negative electrode OCV element function is represented by fe, for example, a logistic function represented by Expression (12) given below can be used.

$$f_e(x) = \frac{z}{1 + \exp\left(-\frac{x-s}{a}\right)} \quad (12)$$

Alternatively, a cumulative distribution function of a Cauchy distribution represented by Expression (13) given below may be used as the candidate fe of the positive electrode OCV element function and the negative electrode OCV element function.

$$f_e(x) = z\left(\frac{1}{\pi}\arctan\left(\frac{x-s}{a}\right) + \frac{1}{2}\right) \quad (13)$$

In Expression (12) and Expression (13), "z" represents a size of the potential change, "a" represents smoothness of the potential change, and "s" represents a parameter for determining a center position of the potential change. Thus, it is possible to model potential changes of various shapes by adjusting those parameter values.

As another example of the OCV element function, a hyperbolic tangent function, or a function that results in an asymmetric curve after differentiation thereof may be used. For example, a Gompertz function, a general logistic function, or the like may be used. In short, it suffices that the function can be represented by such parameters as to exhibit a monotonically non-decreasing function and have a convex peak after differentiation thereof.

Further, in addition to the element functions described above, for example, a logarithmic function, an exponential function, or the like may be used as an element function that models a potential change without a derivative peak.

The OCV element function to be used in the first embodiment is not limited to the above-mentioned example described in the first embodiment, and includes, as candidates, any kinds of functions that may be represented by using parameters.

Figure 9:
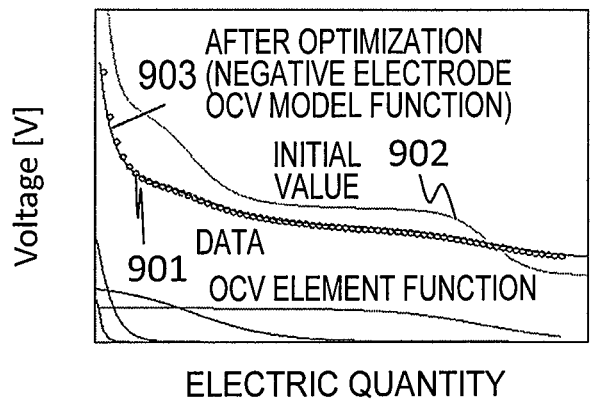
FIG. 9 is an illustration for showing an example of fitting a negative electrode OCV model function to a graphite negative electrode OCV.
Figure 10:
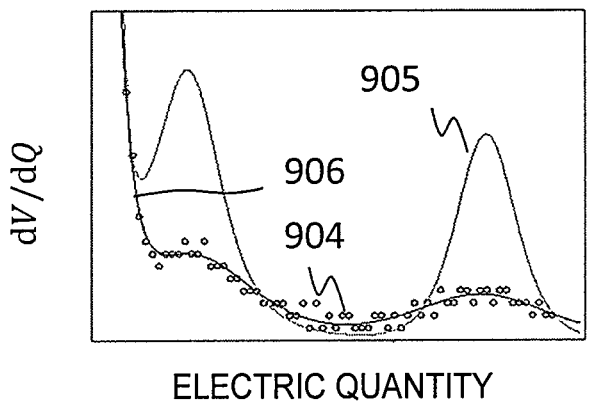
FIG. 10 is an illustration for showing an example of fitting the negative electrode OCV model function to the graphite negative electrode OCV.

FIG. 9 and FIG. 10 show fitting for data on a graphite negative electrode OCV through optimization calculation with a sum of four logistic functions serving as a negative electrode OCV model function as an example. In FIG. 9, the horizontal axis represents an electric quantity, and the vertical axis represents a voltage. Further, in FIG. 10, the horizontal axis represents an electric quantity, and the vertical axis represents dV/dQ, which is obtained by differentiating the voltage V by the electric quantity Q. In FIG. 9 and FIG. 10, as a result of subjecting pieces of data 901 and 904 on the graphite negative electrode OCV to optimization calculation, an OCV curve 903 and a dV/dQ curve 906 are both reproduced accurately for initial values 902 and 905. This is because the potential change due to a phase change is also successfully modeled by the logistic function.

Figure 11:
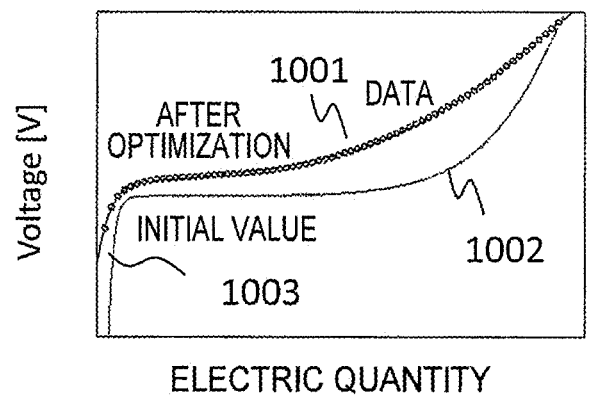
FIG. 11 is an illustration for showing an example of fitting a positive electrode OCV model function to a lithium cobalt oxide positive electrode OCV.
Figure 12:
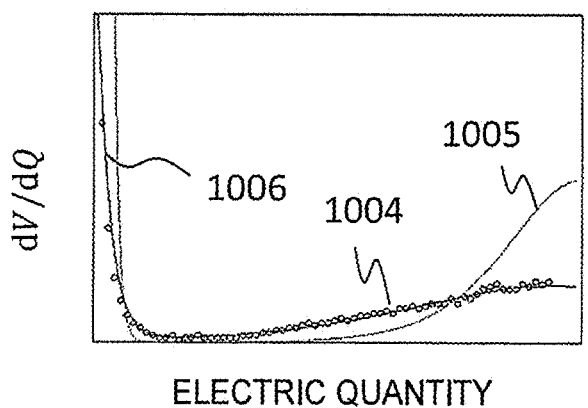
FIG. 12 is an illustration for showing an example of fitting the positive electrode OCV model function to the lithium cobalt oxide positive electrode OCV.

FIG. 11 and FIG. 12 show fitting for data on a lithium cobalt oxide positive electrode OCV through optimization calculation with a sum of two logistic functions serving as a positive electrode OCV model function as an example. In FIG. 11, the horizontal axis represents an electric quantity, and the vertical axis represents a voltage. Further, in FIG. 12, the horizontal axis represents an electric quantity, and the vertical axis represents dV/dQ, which is obtained by differentiating the voltage V by the electric quantity Q. In FIG. 11 and FIG. 12, as a result of subjecting pieces of data 1001 and 1004 on the lithium cobalt oxide positive electrode OCV to optimization calculation, an OCV curve 1003 and a dV/dQ curve 1006 are both reproduced accurately for initial values 1002 and 1005. The graphs have greatly different shapes compared to those of graphite shown in FIG. 9 and FIG. 10, but also in this case, the OCV curve and the dV/dQ curve are reproduced successfully with accuracy.

FIG. 9, FIG. 10, FIG. 11, and FIG. 12 show an example of fitting for the positive electrode OCV data and the negative electrode OCV data in order to show the fact that a sum of OCV element functions can be used to broadly fit the positive electrode OCV function and the negative electrode OCV function having various forms. However, in the first embodiment, fitting for the positive electrode OCV data or the negative electrode OCV data is not performed to be used. In the first embodiment, the storage battery OCV is separated into positive and negative electrodes under a state in which the positive electrode OCV data and the negative electrode OCV data are not acquired.

FIG. 3 is an illustration of an example of an internal structure of the positive/negative electrode OCV model function generation unit 106. In the example of FIG. 3, the positive/negative electrode OCV model function generation unit 106 includes an OCV element function determination unit 301 and a positive/negative electrode OCV model function determination unit 302.

The OCV element function determination unit 301 is configured to determine and output a function form of the OCV element function based on the time-series data output from the data storage unit 104. At this time point, it is not required to determine which of the positive electrode and the negative electrode each OCV element function belongs to. Further, values of a group of parameters that characterize the shape of the OCV element function are also not determined at this time point.

The OCV element function is preferably determined based on the shape of the dV/dQ curve with the horizontal axis serving as the electric quantity Q. That is, the OCV element function determination unit 301 determines the shape of the OCV element function by using, as a representative example, among pieces of time-series data output from the data storage unit 104, the following time-series data on the dV/dQ curve:

$$\{(Q_{i,k}, V_{i,k}^{(1)})\}_{k_o}^{k_f}$$

Candidates of the OCV element function include, for example, a logistic function, a hyperbolic tangent function, and a cumulative distribution function of a Cauchy distribution. Alternatively, a monotonically non-decreasing function may further be added to candidates of the OCV element function. The OCV element function determination unit 301 uses the time-series data output from the data storage unit 104 to select, from among those candidates, the function form of an OCV element function that fits the time-series data best, and determines the selected function form.

The OCV element function determination unit 301 first assigns an OCV element function to the convex peak of the dV/dQ curve one by one. This means assigning an OCV element function to a stepwise potential change of the OCV.

Next, the OCV element function determination unit 301 also associates the OCV element function with a shape change that does not have a peak like the slope of a mountain. This typically corresponds to a steep potential change near SOC=0% or SOC=100%, and also includes a smooth potential change that is exhibited in a positive electrode material, for example.

The OCV element function determination unit 301 appropriately selects, from among various candidates of the OCV element functions described above, an OCV element function depending on the shape of a peak with which the OCV element function is associated.

Figure 13:
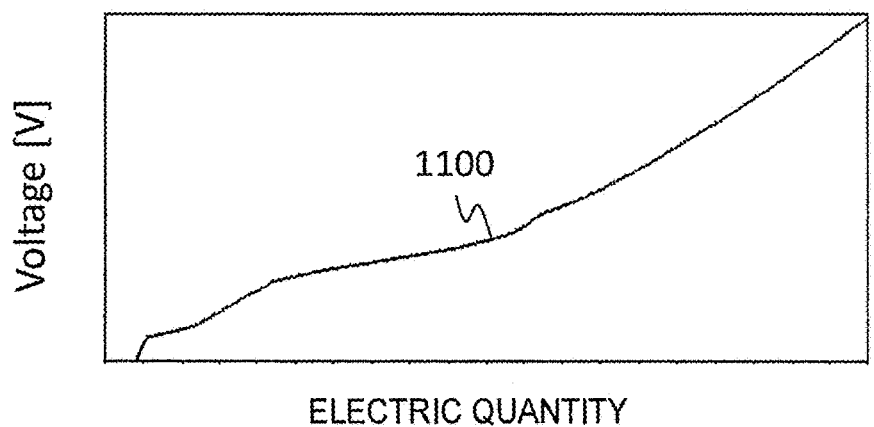
FIG. 13 is an illustration for showing an example of a voltage curve and a dV/dQ curve of a storage battery.
Figure 14:
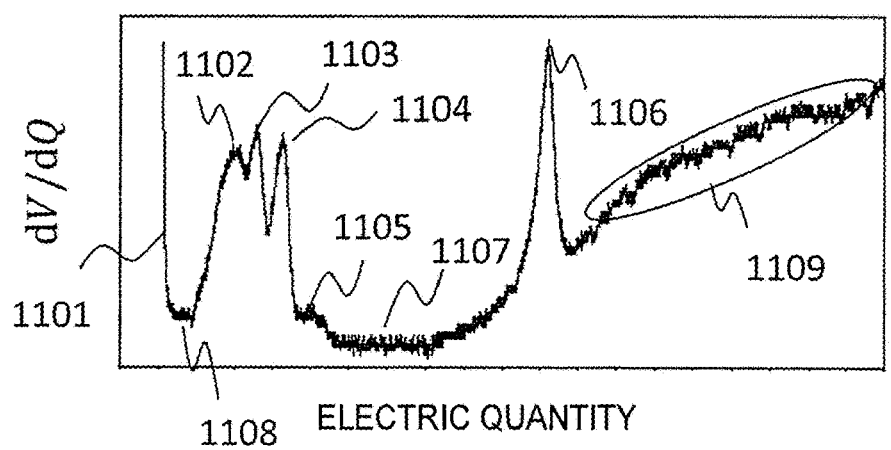
FIG. 14 is an illustration for showing an example of the voltage curve and the dV/dQ curve of the storage battery.

FIG. 13 and FIG. 14 are each an illustration for showing an example of a voltage curve and a dV/dQ curve of the storage battery at a time when the horizontal axis represents the electric quantity Q.

The OCV element function determination unit 301 detects a characteristic voltage change from a voltage curve 1100 of FIG. 13, and assigns an OCV element function to the characteristic voltage change. The characteristic voltage change may typically be considered to be a region in which a tendency of the voltage change greatly changes. That is, it is easier to identify the region in which the tendency of the voltage change greatly changes by referring to the dV/dQ curve of FIG. 14 indicating a derivative value of the voltage V, although this is not indispensable. Regarding the dV/dQ curve of FIG. 14, as an example, a total of eight characteristic voltage changes are detected. Those eight characteristic voltage changes are a large voltage variation (reference numeral 1101) in a low-SOC region, five convex peaks (reference numerals 1102 to 1106), one smooth voltage change (reference numeral 1107), and one more smooth voltage change (reference numeral 1108) due to the fact that a low-SOC valley region is higher than an intermediate-SOC valley region. In this manner, the OCV element function determination unit 301 detects a characteristic voltage change from the voltage curve of FIG. 13, and assigns an OCV element function that fits the characteristic voltage change to the characteristic voltage change.

The number of OCV element functions to be assigned is not absolute, and may be increased or decreased. For example, a fourth peak (reference numeral 1105) from the left of FIG. 14 is small, and thus it may be considered that the OCV element function is not to be assigned, or it is also possible to assign OCV element functions to several slight voltage changes in a high-SOC region (reference numeral 1109).

Further, for example, a mathematical technique of searching for a peak in the dV/dQ curve shown in FIG. 14 may be used to assign an OCV element function. Alternatively, the number of OCV element functions to be assigned is less than 20 at most, and thus the number of OCV element functions to be assigned may be increased one by one until the accuracy of fitting hardly changes.

The positive/negative electrode OCV model function determination unit 302 determines and outputs the function form of the positive/negative electrode OCV model function based on the time-series data output from the data storage unit 104, the OCV element function output from the OCV element function determination unit 301, and an output y from the determination unit 403 provided in the storage battery model function parameter group estimation unit 107.

Specifically, in order to determine the function forms of the positive electrode OCV model function and the negative electrode OCV model function, the positive/negative electrode OCV model function determination unit 302 determines which electrode each OCV element function output from the OCV element function determination unit 301 belongs to, that is, which of the positive electrode and the negative electrode each OCV element function belongs to, and generates a positive electrode OCV model function and a negative electrode OCV model function represented by Expression (9) and Expression (10), respectively.

When the total number of OCV element functions is represented by m, and the total number of OCV element functions for which an electrode to belong to is established is represented by m', each OCV element function belongs to one of two electrodes, namely, the positive electrode or the negative electrode, which means that the total number of combinations is $2^{m-m'}$ at most. Therefore, the positive/negative electrode OCV model function determination unit 302 generates all the possible combination patterns. Patterns of all the OCV element functions belonging to the positive electrode or the negative electrode may be excluded.

The positive/negative electrode OCV model function determination unit 302 selects one pattern from all the possible combination patterns in order, and generates a positive electrode OCV model function and a negative electrode OCV model function. Which one is selected from among all the combinations is determined by using a determination result y of the determination unit 403 provided in the storage battery model function parameter group estimation unit 107. The determination result y represents the number of times optimization calculation has been performed as described later, and thus as a representative example, the value of y and a combination pattern are associated with each other on a one-to-one basis, the association relationship is stored in the memory as a data table, for example, and a combination pattern is determined based on the value of y in accordance with the association relationship. In this manner, which combination is to be selected can be set in advance for each count of optimization calculation, to thereby uniquely determine which combination is to be selected based on the value of y.

The phrase "electrode to belong to is established" refers to a situation in which a specific region of the dV/dQ curve and an element function corresponding thereto are determined to derive from the positive electrode or the negative electrode based on, for example, information on the storage battery to be diagnosed or knowledge of an association relationship between the shape of the voltage curve or dV/dQ curve, and a material type.

Values of a group of parameters that characterize the shape of the positive/negative electrode OCV model function, namely, values of a group of parameters that characterize the shape of the positive/negative electrode OCV model function, may not be determined at this time point.

The storage battery model function parameter group estimation unit 107 acquires the determination result y based on the positive electrode OCV model function and the negative electrode OCV model function generated by the positive/negative electrode OCV model function generation unit 106, and the time-series data output from the data storage unit 104, outputs the determination result y to the positive/negative electrode OCV model function generation unit 106, and outputs, to the outside, the positive/negative electrode OCV model function, estimation values of the group of parameters, and estimation values p, θn, and s of the group of capacity parameters. A detailed description thereof is made below.

FIG. 4 is an illustration of an exemplary internal structure of the storage battery model function parameter group estimation unit 107. In the example of FIG. 4, the storage battery model function parameter group estimation unit 107 includes an optimization problem determination unit 401, an estimation calculation unit 402, and a determination unit 403.

The optimization problem determination unit 401 is configured to determine an optimization problem to be solved by determining the storage battery model function, the group of estimation parameters of the storage battery model function, and the evaluation function L based on the time-series data output from the data storage unit 104.

As a representative example of the evaluation function L, the model of Expression (14) given below, which is represented by a sum of evaluation functions Li for respective storage batteries i, is used.

$$L = \sum_{i=1}^{N} L_i \quad (14)$$

As the evaluation function Li, a weighted sum-of-squares function of an error between $d^j V/dQ^j$ data and the estimation value of $d^j V/dQ^j$, which is represented by Expression (15) given below, for example, is used. The estimation value of $d^j V/dQ^j$ is calculated by subjecting Expression (16) described later to differentiation calculation.

$$L_i = \sum_{j=0}^{d} w_{ij} \sum_{k=k_0}^{k_f} \left( V_{i,k}^{(j)} - \hat{V}_{i,k}^{(j)} \right)^2 \quad (15)$$

In the above expression, the following condition is satisfied:

$$V_{i,k}^{(0)} := V_{i,k}$$

Further, wij represents a weight coefficient for the $d^j V/dQ^j$ data on the storage battery 101-$i$. The weight coefficient wij is set in advance for each combination of values i and j, and is stored into the data table, for example. Further, an estimation value of $d^j V/dQ^j$ for the storage battery 101-$i$ at a time point k is represented by:

$$\hat{V}_{i,k}^{(j)}$$

When only the VQ curve is used to create an evaluation function and execute optimization calculation, in many cases, a stepwise change of the VQ curve due to, for example, a phase change cannot be fully grasped. In contrast, in the first embodiment, the evaluation function L is created in consideration of data on the $d^j V/dQ^j$ (j≥1) curve to optimize an error due to a change in gradient of the voltage curve at the same time, and thus it is considered that the estimation value is more likely to converge to a value near the optimal value in optimization calculation. As a representative example, a first order derivative (j=1) or a second order derivative (j=2) is used, but finite order derivative data of a third or larger order derivative (j≥3) may also be used to create an evaluation function.

The following estimation value:

$$\hat{V}_{i,k}^{(j)}$$

can be calculated by subjecting the storage battery model function of Expression (16) given below to differentiation calculation.

$$\hat{V}_{i,k} = f_p\left(\frac{Q_{i,k}}{\theta_{p,i}}, \theta_{s,i}, \Phi_p\right) - f_n\left(\frac{Q_{i,k}}{\theta_{n,i} F_{typ}}, \Phi_n\right) + R_i I_k \quad (16)$$

The symbols $\theta_{p,i}$, $\theta_{n,i}$, $\theta_{s,i}$ represent the positive electrode capacity retention rate, negative electrode capacity retention rate, and positive/negative electrode SOC shift amount of the storage battery 101-$i$, respectively, and the symbol Ri[Ω] represents an internal resistance of the storage battery 101-$i$. The symbol Φp represents a vector including a group of parameters of the positive electrode model function of each storage battery 101-$i$, and the symbol Φn represents a vector including a group of parameters of the negative electrode model function of the storage battery 101-$i$. In Expression (16), storage batteries have the same parameters.

It is possible to take into consideration an increase in potential due to an excessive voltage and execute optimization by including a term of the internal resistance Ri in the storage battery model function.

An initial value $Q_{i,ini}$ of the electric quantity $Q_{i,k}$ of each storage battery 101-$i$ may be estimated at the same time. With this, it is possible to perform estimation even when the initial value of the electric quantity is unknown.

As an example, when the positive electrode model function fp and the negative electrode model function fn of the storage battery 101-$i$ are constructed only by a logistic function, those functions are represented by Expressions (17) and (18) given below, respectively.

$$f_p\left(\frac{Q_{i,k}}{\theta_{p,i}}, \theta_{s,i}, \Phi_p\right) = \sum_{j=1}^{m_p} f_p^j\left(\frac{Q_{i,k}}{\theta_{p,i}} + \theta_{s,i}, \phi_{p,j}\right) = \sum_{j=1}^{m_p} \frac{z_{p,j}}{1 + \exp\left(-\frac{(Q_{i,k}/(\theta_{p,i} F_{typ}) + \theta_{s,i}) - s_{p,j}}{a_{p,j}}\right)} \quad (17)$$

$$f_n\left(\frac{Q_{i,k}}{\theta_{n,i}}, \Phi_n\right) = \sum_{j=1}^{m_n} f_n^j\left(\frac{Q_{i,k}}{\theta_{n,i}}, \phi_{n,j}\right) = \sum_{j=1}^{m_n} \frac{z_{n,j}}{1 + \exp\left(-\frac{Q_{i,k}/(\theta_{n,i} F_{typ}) - s_{n,j}}{a_{n,j}}\right)} \quad (18)$$

Further, Φp and Φn are represented by Expressions (19) and (20) given below, respectively.

$$\Phi_p = \begin{bmatrix} \phi_{p,1} & \phi_{p,2} & \cdots & \phi_{p,m_p} \end{bmatrix} = \begin{bmatrix} z_{p,1} & z_{p,2} & \cdots & z_{p,m_p} \\ a_{p,1} & a_{p,2} & \cdots & a_{p,m_p} \\ s_{p,1} & s_{p,2} & \cdots & s_{p,m_p} \end{bmatrix} \quad (19)$$

$$\Phi_n = \begin{bmatrix} \phi_{n,1} & \phi_{n,2} & \cdots & \phi_{n,m_n} \end{bmatrix} = \begin{bmatrix} z_{n,1} & z_{n,2} & \cdots & z_{n,m_n} \\ a_{n,1} & a_{n,2} & \cdots & a_{n,m_n} \\ s_{n,1} & s_{n,2} & \cdots & s_{n,m_n} \end{bmatrix} \quad (20)$$

In Expression (17) to Expression (20), the group of capacity parameters θp, θn, and θs is modeled to take different values among storage batteries, and the group of parameters Φp and Φn of positive/negative electrode OCV model functions are modeled to take the same value among all the storage batteries.

In contrast, similarly to the group of capacity parameters, a model in which a part of the group of positive/negative electrode OCV model function parameters is considered to be a value that changes for each storage battery may be constructed.

For example, when only the $a_{p,i}$ and $a_{n,i}$ are different for each storage battery within the positive/negative electrode OCV model function, and the positive/negative electrode element function is constructed with only a logistic function similarly to the above description, the positive electrode model function fp and the negative electrode model function fn of the storage battery i are represented by Expressions (21) and (22) given below, respectively.

$$f_p\left(\frac{Q_{i,k}}{\theta_{p,i}}, \theta_{s,i}, \delta_{p,i}, \Phi_p\right) = \qquad (21)$$

$$\sum_{j=1}^{m_p} f_p^j\left(\frac{Q_{i,k}}{\theta_{p,i}}, \theta_{s,i}, \delta_{p,ij}, \phi_{p,j}\right) = \sum_{j=1}^{m_p} \frac{z_{p,j}}{1 + \exp\left(-\frac{(Q_{i,k}/\theta_{p,i} F_{typ} + \theta_{s,i}) - s_{p,j}}{\delta_{p,ij} a_{p,j}}\right)}$$

$$f_n\left(\frac{Q_{i,k}}{\theta_{n,i}}, \delta_{n,i}, \Phi_n\right) = \qquad (22)$$

$$\sum_{j=1}^{m_n} f_n^j\left(\frac{Q_k}{\theta_{n,i}}, \delta_{n,ij}, \phi_{n,j}\right) = \sum_{j=1}^{m_n} \frac{z_{n,j}}{1 + \exp\left(-\frac{(Q_{i,k}/\theta_{n,i} F_{typ}) - s_{n,j}}{\delta_{n,ij} a_{n,j}}\right)}$$

Further, Φp and Φn are similar to Expression (19) and Expression (20), respectively. Meanwhile, $\delta_{p,i}$ and $\delta_{n,i}$ are represented by Expressions (23) and (24) given below, respectively.

$$\delta_{p,i} = [\delta_{p,i1} \delta_{p,i2} \cdots \delta_{p,im_p}] = [\alpha_{p,1} \alpha_{p,2} \cdots \pi_{p,m_p}] \qquad (23)$$

$$\delta_{n,i} = [\delta_{n,i1} \delta_{n,i2} \cdots \delta_{n,im_n}] = [\alpha_{n,1} \alpha_{n,2} \cdots \pi_{n,m_n}] \qquad (24)$$

It is also known that the peak of the dV/dQ curve becomes smoother along with degradation depending on the type of a storage battery. Expression (23) and Expression (24) represent a group of positive/negative electrode OCV model function degradation parameters that reflect such a degradation behavior of the dV/dQ curve. It is to be understood that the positive/negative electrode OCV model function degradation parameters may be introduced into a larger number of positive/negative electrode OCV model function parameters, or the OCV model function degradation parameters may be introduced only into to the positive electrode or the negative electrode.

As described above, the optimization problem determination unit 401 determines the storage battery model function, the group of estimation parameters, and the evaluation function L, and outputs the information thereon.

The estimation calculation unit 402 performs estimation calculation by an optimization method based on the time-series data output from the data storage unit 104, the storage battery model function output from the optimization problem determination unit 401, the group of estimation parameters, and the evaluation function L. Then, the estimation calculation unit 402 calculates such a group of storage battery model function parameters as to minimize the evaluation function L, and outputs the storage battery model function, estimation values of the group of parameters, and the value of the evaluation function L at the time of using the function and the estimation values.

A non-linear optimization problem to be solved in this case is described below as the most general example.

$$\min_{\Theta_p, \Theta_n, \Theta_s, \Phi_p, \Phi_n, R} L(\Theta_p, \Theta_n, \Theta_s \cdot \Phi_p, \Phi_n, R)$$

$$\text{subject to } \begin{array}{l} g_i(\Theta_p, \Theta_n, \Theta_s \cdot \Phi_p, \Phi_n, R) \leq 0 (i = 1, 2, \ldots, d_g) \\ h_j(\Theta_p, \Theta_n, \Theta_s \cdot \Phi_p, \Phi_n, R) = 0 (j = 1, 2, \ldots, d_h) \end{array}$$

The following definition is given when the storage battery 1 is set to be a reference storage battery and $\theta_{p,1} = \theta_{n,1} = 1$ is satisfied.

$$\Theta_p := [\theta_{p,2}, \theta_{p,2}, \ldots, \theta_{p,N}]^T$$

$$\Theta_n := [\theta_{n,2}, \theta_{n,2}, \ldots, \theta_{n,N}]^T$$

$$\Theta_s := [\theta_{s,2}, \theta_{s,2}, \ldots, \theta_{s,N}]^T$$

$$R := [R_1, R_2, \ldots, R_N]^T$$

The functions $g_i$ and $h_i$ can each be differentiated, and it is assumed that a scalar variable within at least one matrix or vector of Θp, Θn, Θs, Φp, Φn, and R is set as an argument. Further, although $d_g \geq 1$ and $d_h \geq 1$ are satisfied, an equality constraint and an inequality constraint are not always required. It is possible to limit candidates of a solution of the optimization problem by representing, in the form of an equality or an inequality, information on the nature of a storage battery or an electrode material, or information that can be read from the acquired voltage data.

As a simple example, when general knowledge of "OCV element function is monotonically non-decreasing function" is to be reflected, it suffices that $a_i \geq 0$ is satisfied, and thus $-a_i \leq 0$ is included as the inequality constraint. Further, also when knowledge of the fact that an internal resistance value is not negative is to be reflected, $-R_i \leq 0$ may similarly be satisfied. Further, when a center position $s_{p,j}$ of a j-th positive electrode OCV element function $f_p^j$ can be said to fall within $\mu_{p,j} - \delta_{p,j} \leq s_{p,j} \leq \mu_{p,j} + \delta_{p,j}$ by using $\mu_{p,j}$ and an error $\delta_{p,j}$ based on the voltage data or voltage derivative data, $\mu_{p,j} - \delta_{p,j} - s_{p,j} \leq 0$ and $s_{p,j} - \mu_{p,j} - \delta_{p,j} \leq 0$ may be included as the inequality constraint.

Arguments of the functions L, gi (i=1, 2, ..., $d_g$), $h_j$(i=1, 2, ..., $d_h$) are described as Θp, Θn, Θs, Φp, Φn, and R for convenience, but at least one scaler value within at least one matrix or vector among those arguments may be set as a variable, and it is to be understood that the argument may be different for each function.

When the optimization problem does not have a constraint, the optimization method that can be used by the estimation calculation unit 402 is a non-linear optimization method such as a gradient descent method, a Newton's method, a Gauss-Newton method, a Quasi-Newton method, and a Levenberg-Marquardt method. The estimation calculation unit 402 performs estimation calculation by using at least one of those optimization methods to calculate such a group of storage battery model function parameters as to minimize the evaluation function L.

When the optimization problem has a constraint, the estimation calculation unit 402 may solve a constraint optimization problem by taking a constraint condition into consideration. As the solution, various kinds of methods such as a penalty function method, a multiplier method, a sequential quadratic programming method, an interior point method, or a generalized reduced gradient method (GRG method) are known.

The method of solving a non-constraint optimization problem and a constraint optimization problem is only an example, and other optimization methods may be used, or different optimization methods may be used depending on the scale (number of variables) of a problem or calculation resources.

With only the single storage battery data, positive/negative electrode separation cannot be performed unless preliminary information on the storage battery is acquired. However, it is possible to perform positive/negative electrode separation in principle when there are a plurality of pieces of storage battery data having different degradation degrees. This is because a plurality of storage batteries of the same type usually have different degradation degrees due to, for example, an individual difference, a difference in usage environment, or a difference in usage method, with the result that this difference in degradation degree appears as a difference in value of the group of capacity parameters. At this time, among those, optimization calculation is performed $2^{m}-2$ times at most, and a storage battery model function having the smallest value of the evaluation function L indicating an error is a storage battery model function that has accurately performed positive/negative electrode separation. When which of the positive electrode and the negative electrode m' OCV element functions belong to is determined based on the preliminary information, the number of times of optimization calculation is further reduced to $2^{m-m'}$.

The determination unit 403 determines the estimation calculation result of the estimation calculation unit 402 based on the value of the evaluation function L output from the estimation calculation unit 402 for the r-th time. In this case, r indicates an integer of from one to $r_{max}$, which is the maximum number of times of repetition set in advance. In the following description, $r_{max}=2^{m}-2$ is assumed. With this, the determination unit 403 sequentially changes a combination of OCV element functions belonging to the positive electrode or the negative electrode, and performs determination for the values of the evaluation function L calculated for all the combinations. The determination unit 403 outputs the storage battery model function and the group of storage battery model function parameters at a time when the evaluation function L takes the minimum value among all the values of the evaluation function L for the first to $r_{max}$ times. Now, the determination unit 403 is described in detail.

First, the determination unit 403 uses Expression (25) given below to calculate a minimum value $L_{opt,r}$ among values of the evaluation function L being all the estimation calculation results for the past r times, and stores the minimum value $L_{opt,r}$ into the memory. Specifically, as indicated in Expression (25) given below, in the case of the first time (r=1), the value of the evaluation function L is stored into the memory as an optimal value $L_{opt,r}$ of the evaluation function. In the case of the second time (r=2), the value $L_{opt,r}$ stored in the memory and the value of the evaluation function L for the second time are compared with each other, and a smaller value is stored into the memory as the value $L_{opt,r}$. In the case of the third time, the value $L_{opt,r}$ stored in the memory and the value of the evaluation function L for the third time are compared with each other, and a smaller value is stored into the memory as the value $L_{opt,r}$. This processing is repeated $r_{max}$ times, which is the maximum number of times of repetition, so that the smallest value of the evaluation function L through $r_{max}$ times of repetition is stored into the memory as a definitive "optimal value $L_{opt,r}$ of the evaluation function."

$$L_{opt,r} = \begin{cases} L, & \text{for } r = 1 \\ \begin{cases} L_{opt,r-1}, & \text{if } L_{opt,r} < L \\ L, & \text{if } L_{opt,r} \geq L \end{cases} & \text{for } 2 \leq r \leq 2^{m-m'} \end{cases} \quad (25)$$

Further, when a matrix that aggregates all the group of parameters calculated in estimation calculation is represented by $\Theta$, and $\Theta$ at the time when the evaluation function L takes the minimum value $L_{opt,r}$ through r times of estimation calculation is represented by $\Theta_{opt}$, the determination unit 403 calculates $\Theta_{opt}$ in accordance with Expression (26) given below, and stores $\Theta_{opt}$ into the memory. Specifically, as indicated in Expression (26) given below, in the case of the first time (r=1), the value of the matrix (at that time is stored into the memory as the optimal $\Theta_{opt,r}$. In the case of the second time (r=2), the evaluation function $L_{opt,r}$ stored in the memory and the evaluation function L for the second time are compared with each other, and $\Theta$ corresponding to the smaller value of L is stored into the memory as $\Theta_{opt,r}$. In the case of the third time, the value $L_{opt,r}$ of the evaluation function L stored in the memory and the value of the evaluation function L for the third time are compared with each other, and $\Theta$ corresponding to the smaller value of the evaluation function L is stored into the memory as $\Theta_{opt,r}$. This processing is repeated $r_{max}$ times, which is the maximum number of times of repetition, so that the value of $\Theta$ corresponding to the minimum value of the evaluation function L through $r_{max}$ times of repetition is stored into the memory as a definitive "optimal $\Theta_{opt,r}$".

$$\Theta_{opt,r} = \begin{cases} \Theta, & \text{for } r = 1 \\ \begin{cases} \Theta_{opt,r-1}, & \text{if } L_{opt,r} < L \\ \Theta, & \text{if } L_{opt,r} \geq L \end{cases} & \text{for } 2 \leq r \leq 2^{m-m'} \end{cases} \quad (26)$$

Further, when the storage battery model function f at the time when the evaluation function L takes the minimum value $L_{opt,r}$ through r times of estimation calculation is represented by $f_{opt,r}$, the determination unit 403 similarly calculates $f_{opt}$ in accordance with Expression (27) given below, and stores $f_{opt}$ into the memory. Specifically, as indicated in Expression (27) given below, in the case of the first time (r=1), the storage battery model function f at that time is stored into the memory as the optimal $f_{opt,r}$. In the case of the second time (r=2), the evaluation function $L_{opt,r}$ stored in the memory and the evaluation function L for the second time are compared with each other, and f corresponding to the smaller value of L is stored into the memory as $f_{opt,r}$. In the case of the third time, the value $L_{opt,r}$ of the evaluation function L stored in the memory and the value of the evaluation function L for the third time are compared with each other, and f corresponding to the smaller value of the evaluation function L is stored into the memory as $f_{opt,r}$. This processing is repeated $r_{max}$ times, which is the maximum number of times of repetition, so that f corresponding to the minimum value of the evaluation function L through $r_{max}$ times of repetition is stored into the memory as a definitive "optimal $f_{opt,r}$".

$$f_{opt,r} = \begin{cases} f, & \text{for } r = 1 \\ \begin{cases} f_{opt,r-1}, & \text{if } L_{opt,r} < L \\ f, & \text{if } L_{opt,r} \geq L \end{cases} & \text{for } 2 \leq r \leq 2^{m-m'} \end{cases} \quad (27)$$

Further, the determination unit 403 calculates the number of times of estimation calculation in accordance with Expression (28) given below, and stores the number of times into the memory.

$$y = \begin{cases} r+1, & \text{for } r < 2^{m-m'} \\ 1, & \text{for } r = 2^{m-m'} \end{cases} \quad (28)$$

That is, the determination unit 403 counts the number of times next estimation calculation reaches until the number of times r of estimation calculation reaches $2^{m-m'}$, and outputs the value of y=r+1. Then, when the number of times r reaches $2^{m-m'}$, the determination unit 403 resets the value of y to 1 to obtain y=1. The value of y is output to the positive/negative electrode OCV model function generation unit 106.

In this manner, when the number of times r of estimation calculation reaches $r=2^{m-m'}$, estimation calculation of up to the maximum number of times $r_{max}$ is finished. Then, the optimization unit 105 finishes the estimation calculation, and the determination unit 403 outputs y, which has a value of 0 indicating end of operation of the optimization unit 105, to the positive/negative electrode OCV model function generation unit 106. At the same time, the determination unit 403 outputs the optimal storage battery model function f and the optimal group O of estimation parameters to the outside. That is, the determination unit 403 outputs, as the definitive $f_{opt}$ and $\Theta_{opt}$, $f_{opt,r}$ and $\Theta_{opt,r}$ at a time when $r=2^{m-m'}$ is reached, that is, when the number of times of repetition reaches the maximum number of times of repetition $r_{max}$.

The above description is directed to an example in which the determination unit 403 performs repetition determination processing $r_{max}$ times. However, the present invention is not limited thereto. As another method to be performed by the determination unit 403, the determination unit 403 may compare the value of the evaluation function L output from the estimation calculation unit 402 with an error threshold value E set in advance, and determine a success when L<ε is satisfied, or determine a failure when L≥ε is satisfied. In this case, y is calculated in the following manner for L of an r-th estimation calculation result.

$$y = \begin{cases} r, & \text{for } L \geq \varepsilon \\ 1, & \text{for } L < \varepsilon \end{cases} \quad (29)$$

When the value of the evaluation function L is smaller than the error threshold value e and a success is determined, y=1 is output to the positive/negative electrode OCV model function generation unit 106, and $f_{opt,r}$ and $\Theta_{opt,r}$ for the r-th time are output to the outside. On the contrary, when a failure is determined, y=r is output to the positive/negative electrode OCV model function generation unit 106. With this, the positive/negative electrode OCV model function generation unit 106 executes the processing of Step S302 of FIG. 7, namely, the processing of regenerating the positive electrode OCV model function and the negative electrode OCV model function by changing the combination of OCV element functions, which are included in the positive electrode OCV model function and the negative electrode OCV model function, belonging to the positive electrode or the negative electrode. Then, the storage battery model function parameter group estimation unit 107 uses the regenerated positive electrode OCV model function and negative electrode OCV model function to generate a new storage battery model function, and executes the processing of Step S401 to Step S403 of FIG. 7 again. In this manner, the processing of Step S302 to Step S403 of FIG. 7 is repeatedly executed until the value of the evaluation function L becomes smaller than the error threshold value ε.

As described above, two methods to be performed by the determination unit 403 have been described. The determination unit 403 may execute any one of the two methods described above. Further, in any method, the determination unit 403 may further calculate the full charge capacity Fi of each storage battery 101-*i* through calculation of Expressions (6) to (8), and output the full charge capacity Fi together with the definitive determination results $f_{opt,r}$ and $\Theta_{opt,r}$.

Figure 15:
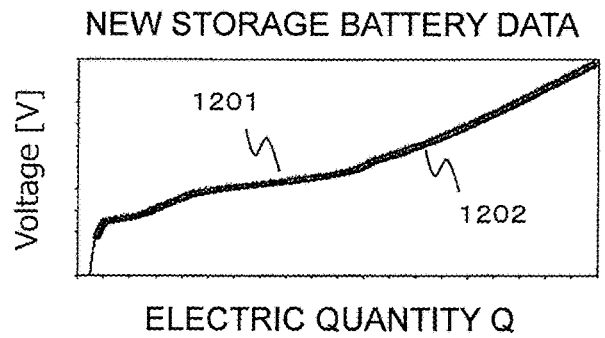
FIG. 15 is an illustration for showing a voltage curve of a new storage battery and results of fitting the storage battery model function to the voltage curve through optimization.
Figure 16:
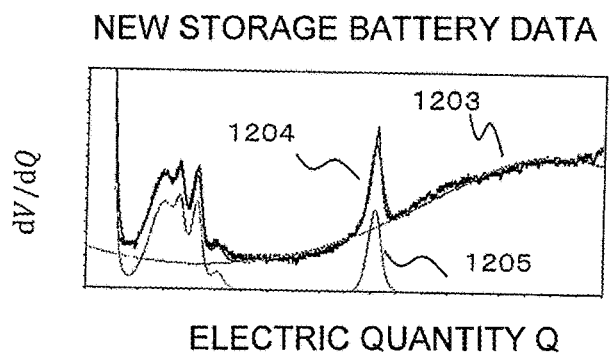
FIG. 16 is an illustration for showing a dV/dQ curve of the new storage battery and results of fitting the storage battery model function to the dV/dQ curve through optimization.
Figure 17:
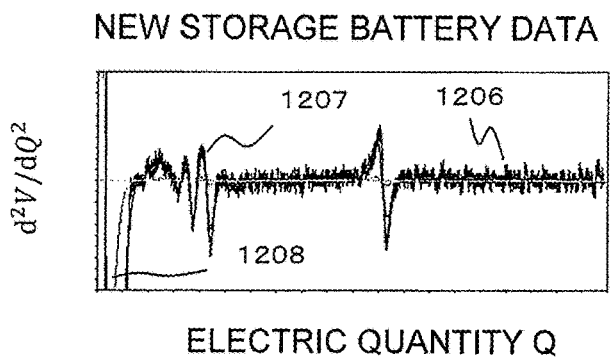
FIG. 17 is an illustration for showing data on a $d^2V/dQ^2$ curve of the new storage battery and results of fitting the storage battery model function to the data through optimization.
Figure 18:
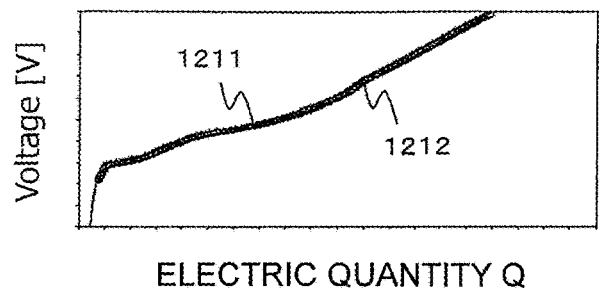
FIG. 18 is an illustration for showing a voltage curve of a degraded storage battery and results of fitting the storage battery model function to the voltage curve through optimization.
Figure 19:
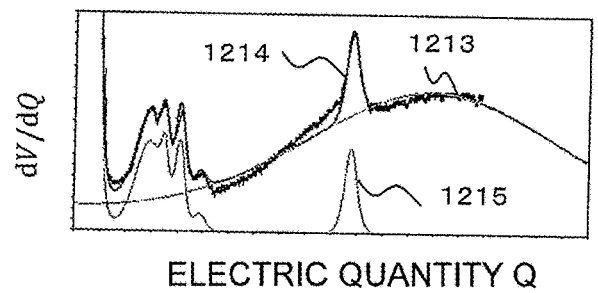
FIG. 19 is an illustration for showing a dV/dQ curve of the degraded storage battery and results of fitting the storage battery model function to the dV/dQ curve through optimization.
Figure 20:
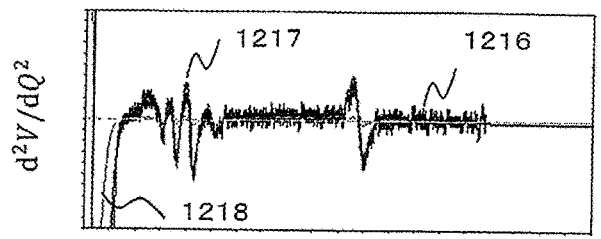
FIG. 20 is an illustration for showing data on a $d^2V/dQ^2$ curve of the degraded storage battery and results of fitting the storage battery model function to the data through optimization.

FIG. 15 to FIG. 20 are examples of optimizing data of charging a new product and degraded product of a storage battery at 1/20 C-rate in addition to dV/dQ data and $d^2V/dQ^2$ data. FIG. 15 to FIG. 17 are illustrations of the case of a new product, and in FIG. 15 to FIG. 17, the horizontal axis represents an electric quantity, and the vertical axes represent a voltage, dV/dQ, and $d^2V/dQ^2$, respectively. Further, FIG. 18 to FIG. 20 are illustrations of the case of a degraded product, and in FIG. 18 to FIG. 20, the horizontal axis represents an electric quantity, and the vertical axes represent a voltage, dV/dQ, and $d^2V/dQ^2$, respectively.

Further, in FIG. 15 to FIG. 17, reference numerals 1201, 1203, and 1206 each represent data, reference numerals 1202, 1204, and 1207 each represent an optimized estimation value, and reference numerals 1205 and 1208 each represent an initial value. Similarly, in FIG. 18 to FIG. 20, reference numerals 1211, 1213, and 1216 each represent data, reference numerals 1212, 1214, and 1217 each represent an optimized estimation value, and reference numerals 1215 and 1218 each represent an initial value.

In FIG. 15 to FIG. 20, Expression (16) is used as the storage battery model function. The group of capacity parameters of the reference storage battery being a new storage battery is set to θp=θn=1 and θs=0, and only the group of capacity parameters of a degraded storage battery is estimated. In all the graphs of FIG. 15 to FIG. 17 and FIG. 18 to FIG. 20, the pieces of data 1201, 1203, 1206, 1211, 1213, and 1216 accurately match estimation values 1202, 1204, 1207, 1211, 1214, and 1217, respectively, and it is understood that the positive electrode OCV model function, the negative electrode OCV model function, the groups of parameters thereof, and an internal resistance of the storage battery are obtained.

Next, description is made of a series of operations to be executed by the storage battery diagnostic device 100 according to the first embodiment when the storage battery diagnostic device 100 diagnoses the characteristics of the storage batteries 101-1, . . . , and 101-N with reference to the flow charts of FIG. 5 to FIG. 7. FIG. 5 is a flow chart for illustrating a series of operations to be executed by the storage battery diagnostic device 100 according to the first embodiment. FIG. 6 is a flow chart for illustrating a series of operations to be executed by the data storage unit 104 in the first embodiment. FIG. 7 is a flow chart for illustrating a series of operations to be executed by the optimization unit 105 in the first embodiment.

In the description of the first embodiment, execution of processing in order of each step illustrated in each flow chart of FIG. 5 to FIG. 7 is described. However, the present invention is not limited thereto, and the order of execution by the storage battery diagnostic device 100 is not limited to the order illustrated in each flow chart, and replacement of the order of execution is allowed as long as the dependence relationship among steps is maintained.

As described above, according to the storage battery diagnostic device of the first embodiment, time-series data on a plurality of storage batteries to be diagnosed is used to enable specific degradation diagnosis by positive/negative electrode separation and accurately correct the change of OCV due to degradation without acquiring pieces of data such as the storage battery OCV data or positive/negative electrode OCV data in advance. In this manner, in the first embodiment, preliminary information on the storage battery to be diagnosed is not indispensable.

Second Embodiment

Now, description is made of a storage battery diagnostic device and diagnosis method according to a second embodiment of the present invention. The configuration of the storage battery diagnostic device according to the second embodiment is the same as that illustrated in FIG. 1 of the first embodiment, and thus description of the configuration is omitted here.

In the second embodiment, pieces of time-series data on N+M storage batteries, which include pieces of time-series data on N storage batteries and pieces of time-series data on M storage batteries stored in the past, are used. Thus, a condition of N+M≥2 is satisfied instead of a condition of N≥2 described in the first embodiment described above.

Thus, in the description of the configuration and operation of the second embodiment, N may be considered to be replaced with N+M in the description of the configuration and operation of the first embodiment described above.

As described above, according to the storage battery diagnostic device and diagnosis method of the second embodiment, even when there is one storage battery to be diagnosed, it is possible to perform specific diagnosis of the storage battery and correction of the OCV through positive/negative electrode separation by using past time-series data on the storage battery. Further, even when there are a plurality of storage batteries, the amount of usable data increases, which enables more reliable and accurate diagnosis.

Third Embodiment

Figure 21:
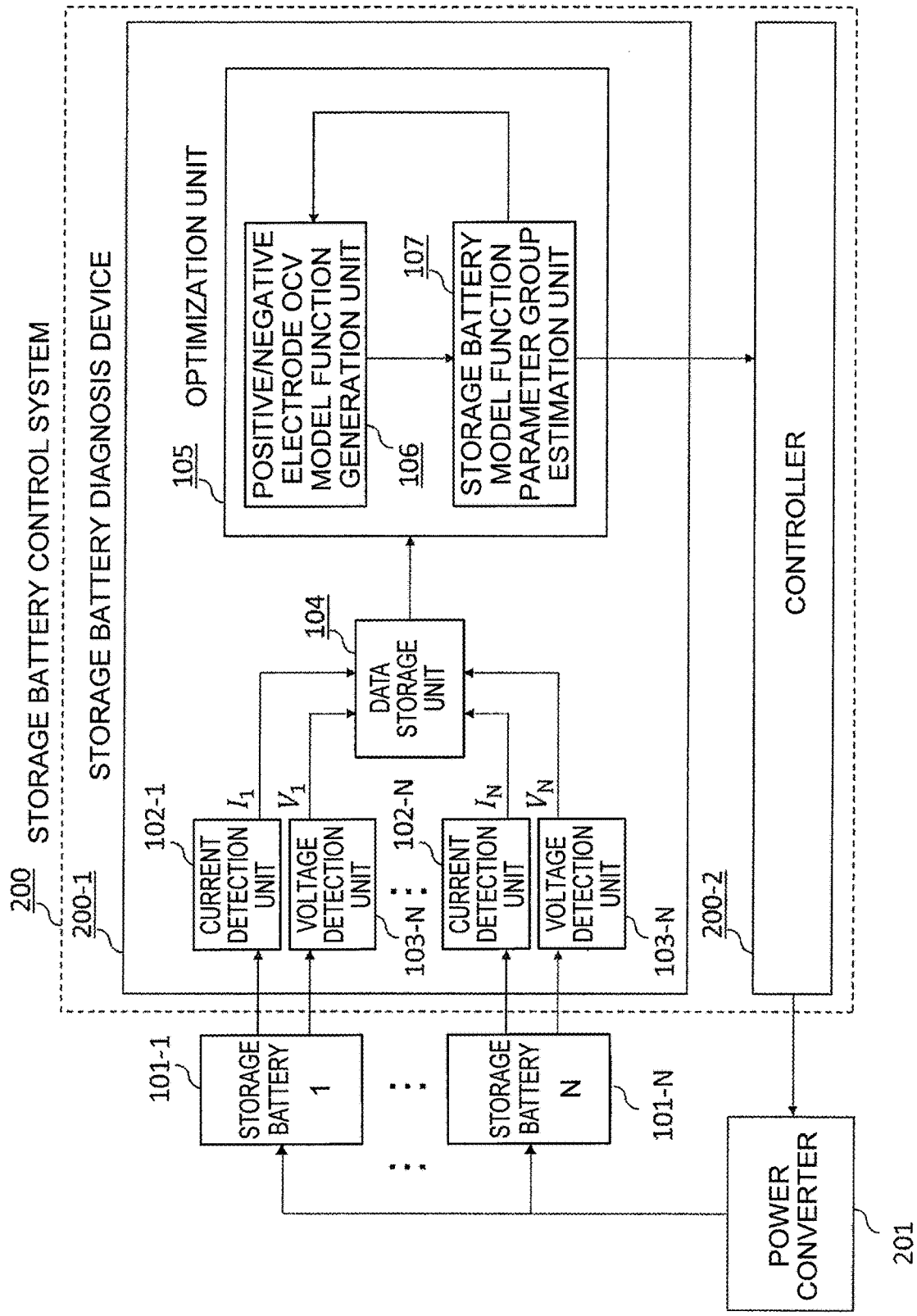
FIG. 21 is a block diagram for illustrating a configuration of a storage battery control system according to a third embodiment of the present invention.

Now, description is made of a storage battery control system 200 according to a third embodiment of the present invention. FIG. 21 is a diagram for illustrating a configuration of the storage battery control system 200 according to the third embodiment of the present invention. In FIG. 21, N (N≥2) storage batteries 101-1, . . . , 101-N connected to the storage battery control system 200, and a power converter 201, to which a control signal is to be transmitted from the storage battery control system 200, are also illustrated.

The storage battery control system 200 includes a storage battery diagnostic device 200-1 and a controller 200-2.

The configuration of the storage battery diagnostic device 200-1 according to the third embodiment is the same as that of the storage battery diagnostic device 100 illustrated in FIG. 1 of the first embodiment, and thus description of the configuration is omitted here.

The controller 200-2 is configured to transmit a control signal to the power converter 201 by using the storage battery model function, the group of parameters thereof, and the group of capacity parameters, which are output from the storage battery diagnostic device 200-1. This control signal is used to adjust input/output power of a storage battery in consideration of (a) power or an amount of power required by an outside of the storage battery, (b) an internal state of the storage battery such as an input/output characteristic, SOC, and degree of degradation, and (c) use efficiency and usability for the user. In this manner, it is possible to control the storage battery more accurately and efficiently by using a diagnosis result output from the storage battery diagnostic device 200-1.

The power converter 201 is configured to control input/output of the storage batteries 101-1, . . . , 101-N based on the control signal transmitted from the storage battery control system 200.

The power converter 201 is, for example, a converter or an inverter installed widely in general in a product in which a storage battery is installed, such as an automobile or a fixed electricity storage system.

The controller 200-2 may be installed inside the power converter 201 instead of the configuration of FIG. 21 described in the third embodiment. In that case, the storage battery control system 200 may include only the storage battery diagnostic device 200-1, and inputs the output of the storage battery model function parameter group estimation unit 107 to the controller 200-2 inside the power converter 201.

Alternatively, instead of the configuration of FIG. 21 illustrated in the third embodiment, the storage battery control system 200 may be installed inside the power converter 201.

That is, the storage battery control system 200 and/or the controller 200-2 may be installed in a lower-level system or an upper-level system.

The storage batteries 101-1, . . . , 101-N, the storage battery control system 200, the controller 200-2, and the power converter 201 may be installed in the same product, or one or more of those components may be installed in a different product. For example, only the storage battery control system 200 may be installed in an upper-level energy management system (EMS) or on a cloud computing system.

Figure 22:
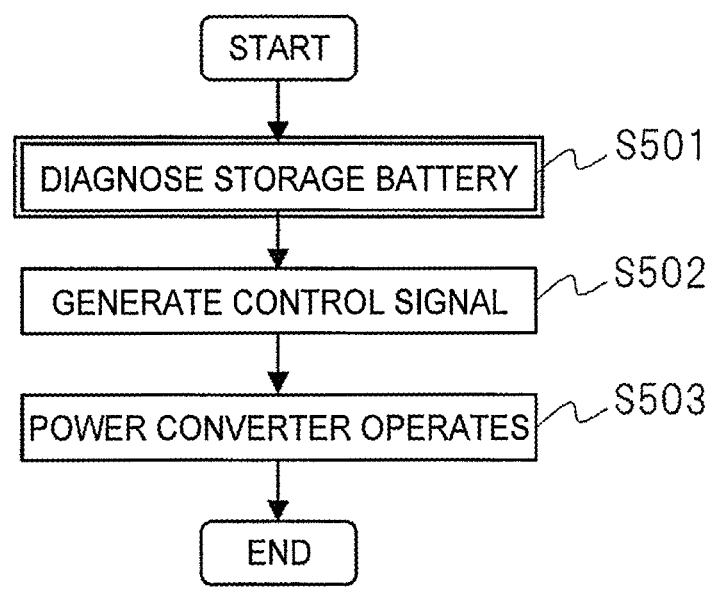
FIG. 22 is a flow chart for illustrating a series of operations to be executed by the storage battery control system according to the third embodiment of the present invention.

Next, description is made of a series of operations to be executed by the storage battery control system 200 according to the third embodiment when the storage battery control system 200 diagnoses the characteristics of the storage batteries 101-1, . . . , 101-N with reference to the flow chart of FIG. 22. FIG. 22 is a flow chart for illustrating a series of operations to be executed by the storage battery control system 200 according to the third embodiment. Specific steps of Step S501 are the processing illustrated in FIG. 5 to FIG. 7 in the first embodiment, and thus description thereof is omitted here. In Step S502, the controller 200-2 receives the diagnosis result obtained in Step S501, and transmits a control signal to the power converter 201. In Step S503, the power converter 201 operates in accordance with the control signal transmitted from the controller 200-2, and controls input/output of the storage batteries 101-1, . . . , 101-N.

As described above, according to the storage battery control system and the storage battery control method of the third embodiment, it is possible to perform more accurate and efficient storage battery control not only by diagnosing the storage battery but also by reflecting the diagnosis result in storage battery control.

REFERENCE SIGNS LIST 101-1, 101-i, 101-N storage battery, 102-1, 102-i, 102-N current detection unit, 103-1, 103-i, 103-N voltage detection unit, 104 data storage unit, 105 optimization unit, 201 time-series data storage unit, 202 time-series electric quantity calculation unit, 203 voltage derivative data calculation unit, 301 OCV element function determination unit, 302 positive/negative electrode OCV model function determination unit, 401 optimization problem determination unit, 402 estimation calculation unit, 403 determination unit, 200 storage battery control system, 200-1 storage battery diagnostic device, 200-2 controller, 201 power converter

The invention claimed is:

1. A storage battery diagnostic device, comprising:
voltage detection circuitries configured to detect inter-terminal voltages of respective N storage batteries as N detected voltages, N being equal to or larger than 2;
a data storage memory configured to store time-series data on the N storage batteries including time-series data on the detected voltages;
positive/negative electrode open-circuit voltage ("OCV") model function generation circuitry configured to obtain OCV element functions that fit the time-series data on the detected voltages stored in the data storage memory, to thereby generate each of positive electrode OCV model function and negative electrode OCV model function corresponding to the N storage batteries by a sum of the OCV element functions;
configured to generate, based on the positive electrode OCV model function and the negative electrode OCV model function, a storage battery model function corresponding to each of the N storage batteries, and to generate an evaluation function indicating an error between the time-series data stored in the data storage memory and time-series data on an estimation value calculated by using the storage battery model function, to thereby calculate such a group of estimation parameters of the N storage battery model functions corresponding to the respective N storage batteries as to minimize a value of the evaluation function; and
current detection circuitries configured to detect respective charge/discharge currents of the N storage batteries as N detected currents,
wherein the data storage memory includes:
time-series electric quantity calculation circuitry configured to calculate time-series data on electric quantities of the N storage batteries based on the N detected currents detected by the current detection circuitries;
voltage derivative data calculation circuitry configured to differentiate the time-series data on the N detected voltages detected by the voltage detection circuitries by the time-series data on the electric quantities of the N storage batteries, to thereby calculate time-series voltage derivative data; and
a time-series data storage memory configured to store time-series data on the N storage batteries including time-series data on the detected currents, the time-series data on the detected voltages, the time-series data on the electric quantities, and the time-series voltage derivative data.

2. The storage battery diagnostic device according to claim 1, wherein the group of estimation parameters of the N storage battery model functions to be calculated by the storage battery model function parameter group estimation circuitry include:
at least one of a group of parameters of the positive electrode OCV model function or a group of parameters of the negative electrode OCV model function, which are the same among the N storage batteries; and
at least one of a group of capacity parameters including a positive electrode capacity retention rate, a negative electrode capacity retention rate, and an SOC shift amount between a positive electrode and a negative electrode, which are different among the N storage batteries.

3. The storage battery diagnostic device according to claim 1, wherein the positive/negative electrode OCV model function generation circuitry includes:
OCV element function determination circuitry configured to detect, based on the time-series voltage derivative data calculated by the voltage derivative data calculation circuitry, a region indicating a characteristic voltage change from the time-series data on the detected voltages, and select, for assignment, an OCV element function that fits the region from among a plurality of candidates of the OCV element function; and
positive/negative electrode OCV model function determination circuitry configured to:
determine which of the positive electrode and the negative electrode the OCV element function assigned to the region belongs to;
generate a combination of OCV element functions belonging to the positive electrode or the negative electrode; and
generate, for each combination, the positive electrode OCV model function by a sum of OCV element functions belonging to the positive electrode, and the negative electrode OCV model function by a sum of OCV element functions belonging to the negative electrode.

4. The storage battery diagnostic device according to claim 3, wherein the plurality of candidates of the OCV element functions include at least one of a logistic function, a hyperbolic tangent function, or a cumulative distribution function of a Cauchy distribution.

5. The storage battery diagnostic device according to claim 3, wherein the storage battery model function parameter group estimation circuitry includes:
optimization problem determination circuitry configured to determine an optimization problem to be solved by generating the storage battery model function, the group of estimation parameters of the storage battery model function, and the evaluation function based on the time-series data stored in the data storage memory;
estimation calculation circuitry configured to calculate, for each combination generated by the positive/negative electrode OCV model function determination circuitry, such values of the group of estimation parameters as to minimize the value of the evaluation function generated by the optimization problem determination circuitry, and output the values of the group of estimation parameters, and values of the storage battery model function and the evaluation function at a time when the group of estimation parameters is used; and
determination circuitry configured to repeatedly perform processing of comparing the value of the evaluation function output from the estimation calculation circuitry with a value of an evaluation function L, which is calculated before and stored as a minimum value, and storing a smaller value of the evaluation function and corresponding values of the group of estimation parameters, to thereby output, as an optimal group of estimation parameters, a group of estimation parameters corresponding to a definitive minimum value of the evaluation function, or the group of estimation parameters at a time when the value of the evaluation function output from the estimation calculation circuitry is smaller than a threshold value set in advance.

6. A storage battery control system, comprising:
the storage battery diagnostic device according to claim 1; and
a controller configured to use the group of estimation parameters of the N storage battery model functions output from the storage battery diagnostic device to generate control signals for the N storage batteries, and output the control signals to a power converter configured to control the N storage batteries.

7. A storage battery diagnostic device, comprising:
voltage detection circuitries configured to detect inter-terminal voltages of respective N storage batteries as N detected voltages, N being equal to or larger than 1;
a data storage memory configured to store N+M pieces of time-series data, which include time-series data on the N storage batteries including time-series data on the detected voltages and time-series data including M detected voltages of storage batteries stored in a past;
positive/negative electrode open-circuit voltage ("OCV") model function generation circuitry configured to obtain OCV element functions that fit the time-series data on the detected voltages stored in the data storage memory, to thereby generate each of positive electrode OCV model function and negative electrode OCV model function corresponding to the N+M pieces of time-series data on the storage batteries based on the OCV element functions;
storage battery model function parameter group estimation circuitry configured to generate, based on the positive electrode OCV model function and the negative electrode OCV model function, a storage battery model function corresponding to each of the N+M pieces of time-series data on the storage batteries, and to generate an evaluation function indicating an error between the time-series data stored in the data storage memory and time-series data on an estimation value calculated by using the storage battery model function, to thereby calculate such a group of estimation parameters of the N+M storage battery model functions corresponding to the respective N+M pieces of time-series data on the storage batteries as to minimize a value of the evaluation function; and
current detection circuitries configured to detect respective charge/discharge currents of the N storage batteries as N detected currents,
wherein the data storage memory includes:
time-series electric quantity calculation circuitry configured to calculate time-series data on electric quantities of the N storage batteries based on the N detected currents detected by the current detection circuitries;
voltage derivative data calculation circuitry configured to differentiate time-series data on the N detected voltages detected by the voltage detection circuitries by the time-series data on the electric quantities of the N storage batteries, to thereby calculate time-series voltage derivative data; and
a time-series data storage memory configured to store N+M pieces of time-series data, which include: time-series data on the N storage batteries including time-series data on the detected currents, the time-series data on the detected voltages, the time-series data on the electric quantities, and the time-series voltage derivative data; and time-series data on M storage batteries stored in the past including time-series data on the detected currents, the time-series data on the detected voltages, the time-series data on the electric quantities, and the time-series voltage derivative data.

8. The storage battery diagnostic device according to claim 7, wherein the positive/negative electrode OCV model function generation circuitry configured to:
generate the positive electrode OCV model function and the negative electrode OCV model function based on a preliminary information of positive/negative electrode separation of the storage battery.

9. The storage battery diagnostic device according to claim 8, wherein the preliminary information includes information on an association relationship between the shape of a voltage curve or a voltage derivative curve, and a material type separation of the storage battery.

10. The storage battery diagnostic device according to claim 7, wherein the positive/negative electrode OCV model function generation circuitry includes:
OCV element function determination circuitry configured to detect, based on the time-series voltage derivative data calculated by the voltage derivative data calculation circuitry, a region indicating a characteristic voltage change from the time-series data on the detected voltages, and select, for assignment, an OCV element function that fits the region from among a plurality of candidates of the OCV element function; and
positive/negative electrode OCV model function determination circuitry configured to:
determine which of the positive electrode and the negative electrode the OCV element function assigned to the region belongs to;
generate a combination of OCV element functions belonging to the positive electrode or the negative electrode; and
generate, for each combination, the positive electrode OCV model function by a sum of OCV element functions belonging to the positive electrode, and the negative electrode OCV model function by a sum of OCV element functions belonging to the negative electrode.

11. The storage battery diagnostic device according to claim 10, wherein the plurality of candidates of the OCV element functions include at least one of a logistic function, a hyperbolic tangent function, or a cumulative distribution function of a Cauchy distribution.

12. The storage battery diagnostic device according to claim 10, wherein the storage battery model function parameter group estimation circuitry includes:
optimization problem determination circuitry configured to determine an optimization problem to be solved by generating the storage battery model function, the group of estimation parameters of the storage battery model function, and the evaluation function based on the time-series data stored in the data storage memory;
estimation calculation circuitry configured to calculate, for each combination generated by the positive/negative electrode OCV model function determination circuitry, such values of the group of estimation parameters as to minimize the value of the evaluation function generated by the optimization problem determination circuitry, and output the values of the group of estimation parameters, and values of the storage battery model function and the evaluation function at a time when the group of estimation parameters is used; and
determination circuitry configured to repeatedly perform processing of comparing the value of the evaluation function output from the estimation calculation circuitry with a value of an evaluation function L, which is calculated before and stored as a minimum value, and storing a smaller value of the evaluation function and corresponding values of the group of estimation parameters, to thereby output, as an optimal group of estimation parameters, a group of estimation parameters corresponding to a definitive minimum value of the evaluation function, or the group of estimation parameters at a time when the value of the evaluation function output from the estimation calculation circuitry is smaller than a threshold value set in advance.

13. A storage battery control system, comprising:
the storage battery diagnostic device of claim 7; and
a controller configured to use the group of estimation parameters of the N+M storage battery model functions output from the storage battery diagnostic device to generate control signals for the N+M storage batteries, and output the control signals to a power converter configured to control the N+M storage batteries.

14. A storage battery diagnostic method, the storage battery diagnostic method comprising the steps of:
detecting inter-terminal voltages of respective N storage batteries as N detected voltages, N being equal to or larger than 2;
storing, into a memory, time-series data on the N storage batteries including time-series data on the detected voltages; and
obtaining open-circuit voltage ("OCV") element functions that fit the time-series data on the detected voltages stored in the memory, to thereby generate each of positive electrode OCV model function and negative electrode OCV model function corresponding to the N storage batteries by a sum of the OCV element functions;
generating, based on the positive electrode OCV model function and the negative electrode OCV model function, a storage battery model function corresponding to each of the N storage batteries, and generating an evaluation function indicating an error between the time-series data stored in the memory and time-series data on estimation data calculated by using the storage battery model function, to thereby calculate such a group of estimation parameters of the N storage battery model functions corresponding to the respective N storage batteries as to minimize a value of the evaluation function;
detecting respective charge/discharge currents of the N storage batteries as N detected currents;
calculating time-series data on electric quantities of the N storage batteries based on the N detected currents which have been detected;
differentiating the time-series data on the N detected voltages by the time-series data on the electric quantities of the N storage batteries, to thereby calculate time-series voltage derivative data; and
storing time-series data on the N storage batteries including time-series data on the detected currents, the time-series data on the detected voltages, the time-series data on the electric quantities, and the time-series voltage derivative data,
wherein the group of estimation parameters of the N storage battery model functions calculated in the step of calculating such a group of estimation parameters include:

at least one of a group of parameters of the positive electrode OCV model function or a group of parameters of the negative electrode OCV model function, which are the same among the N storage batteries; and
at least one of a group of capacity parameters including a positive electrode capacity retention rate, a negative electrode capacity retention rate, or an SOC shift amount between a positive electrode and a negative electrode, which are different among the N storage batteries, or
the storage battery diagnostic method comprising the steps of:
detecting inter-terminal voltages of respective N storage batteries as N detected voltages, N being equal to or larger than 1;
storing, into a memory, N+M pieces of time-series data, which include: time-series data on the N storage batteries including time-series data on the detected voltages; and time-series data including M detected voltages of storage batteries stored in a past; and
obtaining OCV element functions that fit the time-series data on the detected voltages stored in the memory, to thereby generate each of the positive electrode OCV model function and the negative electrode OCV model function corresponding to the N+M pieces of time-series data on the storage batteries based on the OCV element functions;
generating, based on the positive electrode OCV model function and the negative electrode OCV model function, a storage battery model function corresponding to each of the N+M pieces of time-series data on the storage batteries, and generating an evaluation function indicating an error between the time-series data stored in the memory and time-series data on estimation data calculated by using the storage battery model function, to thereby calculate such a group of estimation parameters of the N+M storage battery model functions corresponding to the respective N+M pieces of time-series data on the storage batteries as to minimize a value of the evaluation function;
detecting respective charge/discharge currents of the N storage batteries as N detected currents,
calculating time-series data on electric quantities of the N storage batteries based on the N detected currents:
differentiating time-series data on the N detected voltages detected by the time-series data on the electric quantities of the N storage batteries, to thereby calculate time-series voltage derivative data; and
storing N+M pieces of time-series data, which include: time-series data on the N storage batteries including time-series data on the detected currents, the time-series data on the detected voltages, the time-series data on the electric quantities, and the time-series voltage derivative data; and time-series data on M storage batteries stored in the past including time-series data on the detected currents, the time-series data on the detected voltages, the time-series data on the electric quantities, and the time-series voltage derivative data.

* * * * *